(12) United States Patent
Chen

(10) Patent No.: US 12,190,825 B2
(45) Date of Patent: Jan. 7, 2025

(54) DISPLAY SCREEN AND ELECTRONIC DEVICE

(71) Applicant: Honor Device Co., Ltd., Shenzhen (CN)

(72) Inventor: Pengming Chen, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 18/290,507

(22) PCT Filed: Sep. 1, 2022

(86) PCT No.: PCT/CN2022/116530
§ 371 (c)(1),
(2) Date: Nov. 14, 2023

(87) PCT Pub. No.: WO2023/098194
PCT Pub. Date: Jun. 8, 2023

(65) Prior Publication Data
US 2024/0282267 A1    Aug. 22, 2024

(30) Foreign Application Priority Data
Nov. 30, 2021 (CN) .......................... 202111449835.1

(51) Int. Cl.
G09G 3/3266 (2016.01)
G09G 3/00 (2006.01)
G09G 3/36 (2006.01)

(52) U.S. Cl.
CPC .......... *G09G 3/3266* (2013.01); *G09G 3/006* (2013.01); *G09G 3/3677* (2013.01); *G09G 2330/12* (2013.01)

(58) Field of Classification Search
None
See application file for complete search history.

(56) References Cited

U.S. PATENT DOCUMENTS

| | | | |
|---|---|---|---|
| 10,614,768 B2 | 4/2020 | Wang et al. | |
| 11,087,655 B2 | 8/2021 | Weng et al. | |
| 11,145,231 B2 | 10/2021 | Lin | |
| 11,238,763 B2 | 2/2022 | Li et al. | |
| 2016/0247430 A1 | 8/2016 | Cho et al. | |

(Continued)

FOREIGN PATENT DOCUMENTS

| | | |
|---|---|---|
| CN | 105575301 A | 5/2016 |
| CN | 106023949 A | 10/2016 |

(Continued)

*Primary Examiner* — Ifedayo B Iluyomade
(74) *Attorney, Agent, or Firm* — Leydig, Voit & Mayer, Ltd.

(57) ABSTRACT

Embodiments of this application provide a display screen and an electronic device. The display screen includes: a display unit, a gate driver on array circuit connected to the display unit, and a detection unit connected to the gate driver on array circuit. The gate driver on array circuit is configured to: generate a scan signal, and drive, by using the scan signal, the display unit to perform displaying. The detection unit is configured to: detect the scan signal of the gate driver on array circuit, and obtain and output a feedback signal, where the feedback signal is configured to determine whether a plurality of gate lines of the display unit are driven simultaneously.

11 Claims, 21 Drawing Sheets

(56) References Cited

U.S. PATENT DOCUMENTS

| | | | |
|---|---|---|---|
| 2020/0090571 A1* | 3/2020 | Li | ............................ G09G 3/20 |
| 2021/0241663 A1* | 8/2021 | Li | ........................ G11C 19/287 |

FOREIGN PATENT DOCUMENTS

| | | | |
|---|---|---|---|
| CN | 107068084 | A | 8/2017 |
| CN | 107167975 | A | 9/2017 |
| CN | 108154833 | A | 6/2018 |
| CN | 108877610 | A | 11/2018 |
| CN | 109166504 | A | 1/2019 |
| CN | 109243347 | A | 1/2019 |
| CN | 210467287 | U | 5/2020 |
| CN | 111384068 | A | 7/2020 |
| JP | 2010113299 | A | 5/2010 |
| KR | 19990063009 | A | 7/1999 |
| WO | 2019242514 | A1 | 12/2019 |

\* cited by examiner

DISPLAY SCREEN AND ELECTRONIC DEVICE

CROSS-REFERENCE TO RELATED APPLICATIONS

This application is a national stage of International Application No. PCT/CN2022/116530, filed on Sep. 1, 2022, which claims priority to Chinese Patent Application No. 202111449835.1, filed on Nov. 30, 2021. The disclosures of both of the aforementioned applications are hereby incorporated by reference in their entireties.

TECHNICAL FIELD

This application relates to the technical field of display screens, and in particular, to a display screen and an electronic device.

BACKGROUND

Generally, a line scanning manner of a display screen is designed by using a gate driver on array (Gate on Array, GoA). A display screen control module of the display screen receives a control instruction of a processor, outputs one or more sets of clock signals, and inputs the clock signals to a gate driver on array GoA circuit of a display panel. The gate driver on array circuit generates a line scan signal based on the clock signals, and sends the line scan signal to a display unit of the display panel, thereby controlling the display unit to perform displaying.

However, in an actual running process of the display screen, due to an impact of a temperature of an external environment, an electrostatic field, or another factor, a TFT of each GoA unit in the gate driver on array circuit may become abnormal. As a result, switching on and switching off of the TFT cannot be driven by using a conventional drive signal. In addition, the clock signals are also affected by the temperature of the external environment, the electrostatic field, or the another factor, resulting in an abnormal time sequence. Either when the TFT in the gate driver on array circuit becomes abnormal or when the time sequence of the clock signals becomes abnormal, a plurality of gate lines of the display unit are started simultaneously based on scan signals output by a plurality of GoA units in the gate driver on array circuit. As a result, the display screen performs serial displaying, and a grainy screen is displayed.

SUMMARY

This application provides a display screen and an electronic device, to implement detection on the following problem: When a plurality of gate lines of a display unit are started simultaneously based on scan signals output by a plurality of GoA units in a gate driver on array circuit, a display screen performs serial displaying, and a grainy screen is displayed.

To achieve the foregoing objective, the following technical solutions are provided in this application:

According to a first aspect, this application provides a display screen. The display screen is used in an electronic device and includes: a display unit, a gate driver on array circuit connected to the display unit, and a detection unit connected to the gate driver on array circuit, where the gate driver on array circuit is configured to: generate a scan signal, and drive, by using the scan signal, the display unit to perform displaying; and the detection unit is configured to: detect the scan signal of the gate driver on array circuit, and obtain and output a feedback signal, where the feedback signal is configured to determine whether a plurality of gate lines of the display unit are driven simultaneously.

It can be learned from the foregoing content that, when the gate driver on array circuit of the display screen is connected to the detection unit, the detection unit detects the scan signal of the gate driver on array circuit and outputs the feedback signal. Because the feedback signal is configured to determine whether the plurality of gate lines of the display unit are driven simultaneously, whether the plurality of gate lines are driven simultaneously can be detected, thereby further preventing displaying of a grainy screen caused by serial displaying.

In a possible implementation, the detection unit is connected to two gate driver on array GoA units at a tail end of the gate driver on array circuit.

In this implementation, because scan signals output by the GoA units at the tail end of the gate driver on array circuit can reflect output signals of all GoA units in the gate driver on array circuit, whether scan signals output by every two GoA units in the gate driver on array circuit are simultaneously output scan signals can be determined by connecting the detection unit to the two GoA units at the tail end of the gate driver on array circuit.

In a possible implementation, the detection unit includes a first transistor, a second transistor, and a third transistor, where a gate of the first transistor is configured to receive a first voltage, a source of the first transistor is configured to receive a second voltage, a drain of the first transistor is connected to a source of the second transistor, the first voltage is a switch-on voltage of a transistor in the gate driver on array circuit, the second voltage is a switch-off voltage of the transistor in the gate driver on array circuit, and a common terminal of the drain of the first transistor and the source of the second transistor is configured to output the feedback signal: a gate of the second transistor is connected to one GoA unit of the gate driver on array circuit, and a drain of the second transistor is connected to a drain of the third transistor; and a gate of the third transistor is connected to another GoA unit of the gate driver on array circuit, and a source of the third transistor is configured to receive the first voltage.

In this implementation, the gate of the second transistor is connected to one GoA unit of the gate driver on array circuit, and the gate of the third transistor is connected to another GoA unit of the gate driver on array circuit. When the two GoA units output scan signals at different times to drive a plurality of gate lines, only one of the second transistor and the third transistor is switched on, the first transistor is also switched on because the first voltage is greater than the second voltage, and the feedback signal output by the common terminal of the drain of the first transistor and the source of the second transistor is the second voltage. At a moment when the two GoA units output scan signals simultaneously, both the second transistor and the third transistor are switched on, the first transistor is still in the switched-on state, and the feedback signal output by the common terminal of the drain of the first transistor and the source of the second transistor is jumped from the second voltage to the first voltage. Therefore, whether the plurality of gate lines are driven simultaneously can be detected based on a voltage value in the feedback signal, thereby further preventing displaying of a grainy screen caused by serial displaying.

In a possible implementation, the detection unit is further configured to connect to a display screen control module of the display screen, so that the detection unit sends the feedback signal to the display screen control module; and the display screen control module is configured to determine an identification result based on the feedback signal, where the identification result is used to indicate whether the gate driver on array circuit uses the scan signal to drive the plurality of gate lines of the display unit simultaneously.

In a possible implementation, that the display screen control module is configured to determine an identification result based on the feedback signal, where the identification result is used to indicate whether the gate driver on array circuit uses the scan signal to drive the plurality of gate lines of the display unit simultaneously includes: the display screen control module identifies that the feedback signal is the first voltage, and determines a first identification result, where the first identification result is used to indicate that the gate driver on array circuit does not use the scan signal to drive the plurality of gate lines of the display unit simultaneously, and the first voltage is the switch-on voltage of the transistor in the gate driver on array circuit; and the display screen control module identifies that the feedback signal is the second voltage, and determines a second identification result, where the second identification result is used to indicate that the gate driver on array circuit uses the scan signal to drive the plurality of gate lines of the display unit simultaneously, and the second voltage is the switch-off voltage of the transistor in the gate driver on array circuit.

In a possible implementation, the display screen control module is further configured to send the identification result to a processor of the electronic device.

In a possible implementation, the detection unit is further configured to connect to a processor of the electronic device, so that the detection unit transmits the feedback signal to the processor; and the processor is configured to determine an identification result based on the feedback signal, where the identification result is used to indicate whether the gate driver on array circuit uses the scan signal to drive the plurality of gate lines of the display unit simultaneously.

In a possible implementation, that the processor is configured to determine an identification result based on the feedback signal, where the identification result is used to indicate whether the gate driver on array circuit uses the scan signal to drive the plurality of gate lines of the display unit simultaneously includes: the processor identifies that the feedback signal is the first voltage, and determines a first identification result, where the first identification result is used to indicate that the gate driver on array circuit does not use the scan signal to drive the plurality of gate lines of the display unit simultaneously, and the first voltage is the switch-on voltage of the transistor in the gate driver on array circuit; and the processor identifies that the feedback signal is the second voltage, and determines a second identification result, where the second identification result is used to indicate that the gate driver on array circuit uses the scan signal to drive the plurality of gate lines of the display unit simultaneously, and the second voltage is the switch-off voltage of the transistor in the gate driver on array circuit.

In a possible implementation, a length-width ratio of the first transistor is less than those of the second transistor and the third transistor.

In a possible implementation, a size of the first transistor is less than those of the second transistor and the third transistor.

In a possible implementation, the first transistor, the second transistor, and the third transistor each include an N-type thin film transistor TFT or a P-type thin film transistor TFT.

According to a second aspect, this application provides an electronic device, including: one or more processors, a memory, and the display screen according to any implementation of the first aspect, where the memory is coupled to the one or more processors, the memory is configured to store computer program code, and the computer program code includes computer instructions.

DESCRIPTION OF EMBODIMENTS

Figure 1A:
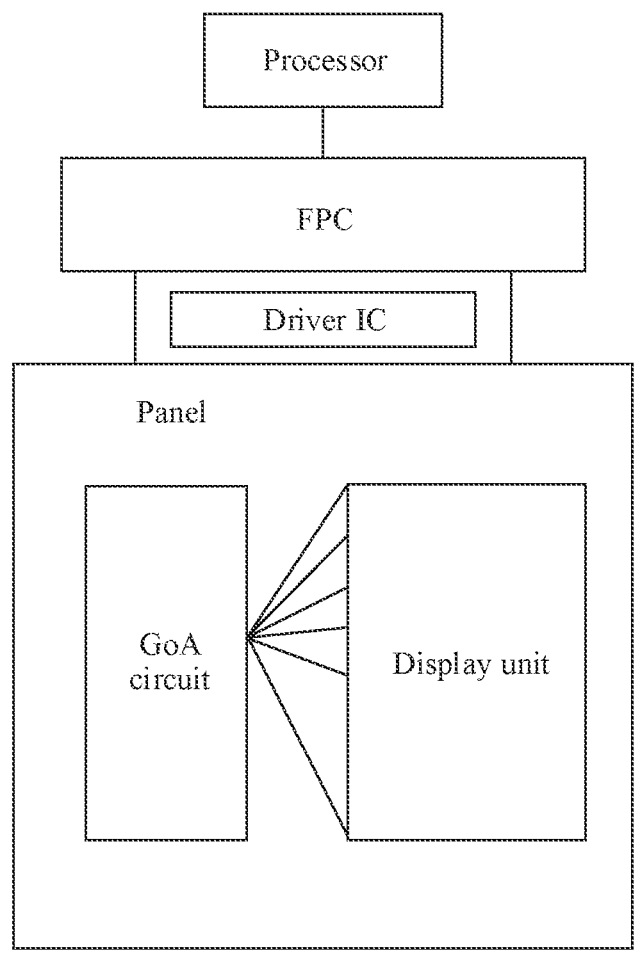
FIG. 1A is a schematic diagram of a structure of a display screen.

The technical solutions in the embodiments of this application will be clearly and completely described below with reference to the accompanying drawings in the embodiments of this application. Terms used in the following embodiments are merely intended to describe particular embodiments, but are not intended to limit this application. The terms "one", "a", "the", "the foregoing", "this", and "the one" of singular forms used in this specification and the appended claims of this application are also intended to include expressions such as "one or more", unless otherwise specified in the context clearly. It should be further understood that in the embodiments of this application, "one or more" means one, two, or more than two; and the term "and/or" describes an association relationship between associated objects and represents that three relationships may exist. For example, "A and/or B" may represent that only A exists, both A and B exist, and only B exists, where A and B may be singular or plural. A character "/" generally indicates an "or" relationship between associated objects.

Reference to "an embodiment", "some embodiments", or the like described in this specification indicates that one or more embodiments of this application include a specific feature, structure, or characteristic described with reference to the embodiments. Therefore, statements such as "in an embodiment", "in some embodiments", "in some other embodiments", and "in still some other embodiments" that appear at different places in this specification do not necessarily refer to a same embodiment. Instead, the statements mean "one or more but not all of embodiments", unless otherwise especially emphasized in another manner. The terms "include", "contain", "have", and their variants all mean "include but are not limited to", unless otherwise especially emphasized in another manner.

"A plurality of" in embodiments of this application means "greater than or equal to two". It should be noted that in the description of embodiments of this application, words such as "first" and "second" are merely used for distinguishing in the description, cannot be understood as indicating or implying relative importance, and cannot be understood as indicating or implying a sequence.

Related concepts in this application are explained below; to more clearly clarify the technical solutions of this application.
(1) FPC (flexible printed circuit): A highly reliable and optimal flexible printed circuit board made by using polyimide or polyester film as a material.
(2) COP (Chip On PI): A packaging technology of directly bending a portion of a screen made of a flexible material backwards, thereby further reducing a frame to achieve a nearly borderless effect.
(3) GoA (Gate on Array, gate driver on array), also referred to as GiP (Gate in Panel): A technology of producing a gate line scanning drive signal circuit on an array substrate by using a thin film transistor liquid crystal display array process, thereby implementing a driving manner of scanning a gate line by line. A gate driver on array GoA circuit is specifically configured to output line scan signals line by line based on a clock signal.
(4) TFT (thin film transistor)

Generally, a line scanning manner of a display screen is designed by using a GoA. With reference to FIG. 1A, a display screen control module driver IC of a display screen receives a control instruction of a processor, outputs one or more sets of clock signals, and inputs the clock signals to a GoA array of a display panel panel. A gate driver on array circuit generates a line scan signal based on the clock signals, and sends the line scan signal to a display unit of the display panel panel, thereby controlling the display unit of the display panel panel to perform displaying.

Figure 1B:
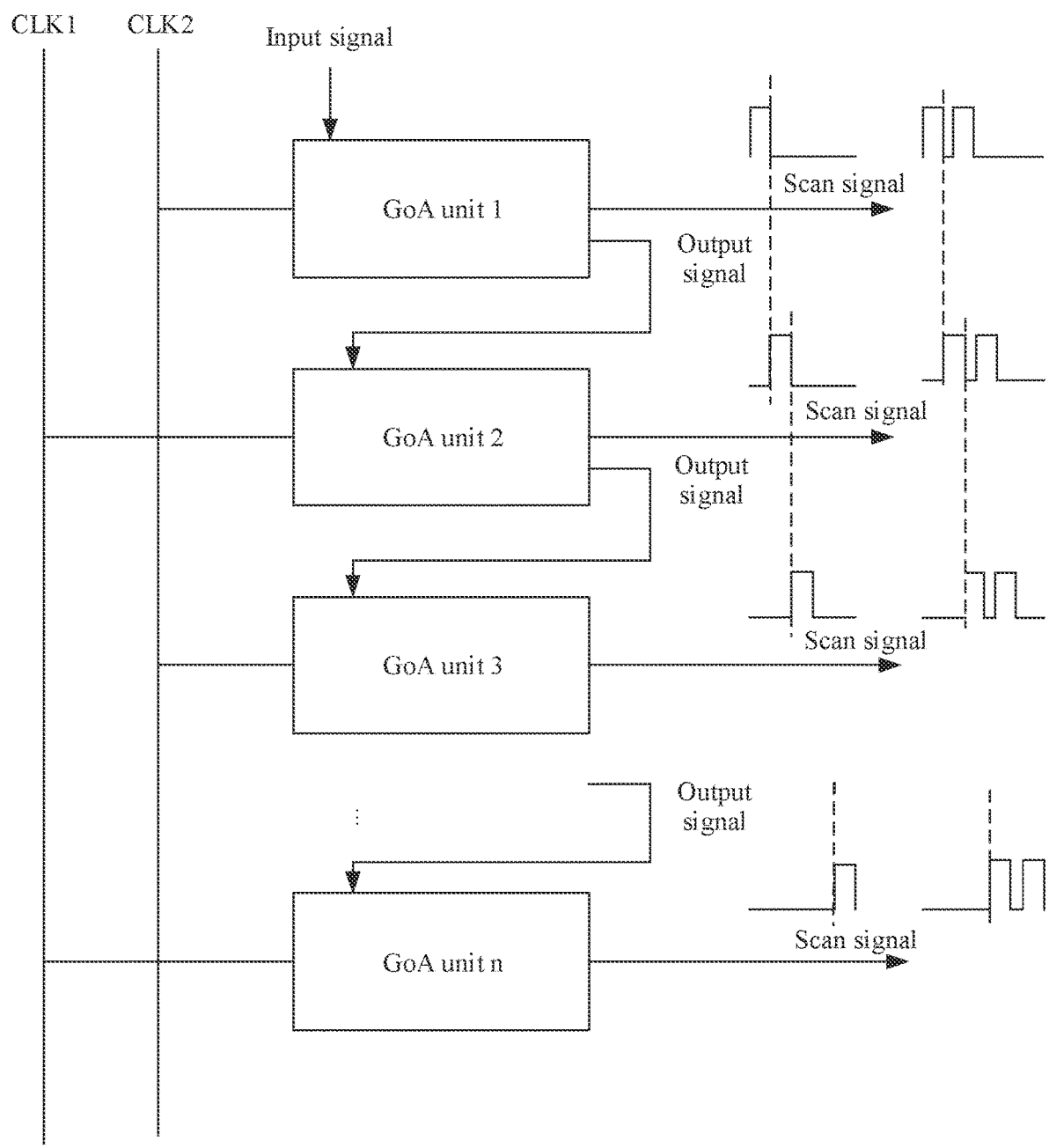
FIG. 1B is a display diagram of a running process of a gate driver on array circuit in a display screen.

Specifically, in an example displayed in FIG. 1B, the driver IC outputs two clock signals to the gate driver on array circuit. The gate driver on array circuit includes n GoA units, where n is a positive integer greater than 3. Each GoA unit includes a plurality of TFTs. Each GoA unit corresponds to a gate line of the display unit. Specifically, an output end of each GoA unit is connected to a gate line. A scan signal generated by the GoA unit acts on the gate line.

In the example displayed in FIG. 1B, a running process of the display screen may be as follows:

Under the action of an input signal and a clock signal CLK2, a GoA unit 1 generates a scan signal, and provides the scan signal for a corresponding gate line, thereby controlling the gate line to start. Moreover, the GoA unit 1 further provides a GoA unit 2 with an output signal (it may be understood that the output signal is the same as the scan signal), under the action of the output signal of the GoA unit 1 and a clock signal CLK1, the GoA unit 2 generates a scan signal and provides the scan signal for a corresponding gate line. Other cases can be deduced by analogy until a GoA unit n of the gate driver on array circuit generates a scan signal and provides the scan signal for a corresponding gate line.

However, in an actual running process of the display screen, due to an impact of a temperature of an external environment, an electrostatic field, or another factor, a TFT of each GoA unit in the gate driver on array circuit may become abnormal. As a result, switching on and switching off of the TFT cannot be driven by using a conventional drive signal. In addition, the clock signals output by the driver IC are also affected by the temperature of the external environment, the electrostatic field, or the another factor, resulting in an abnormal time sequence. Either when the TFT in the gate driver on array circuit becomes abnormal or when the time sequence of the clock signals output by the driver IC becomes abnormal, a plurality of gate lines are started simultaneously based on scan signals output by a plurality of GoA units in the gate driver on array circuit.

Figure 1C:
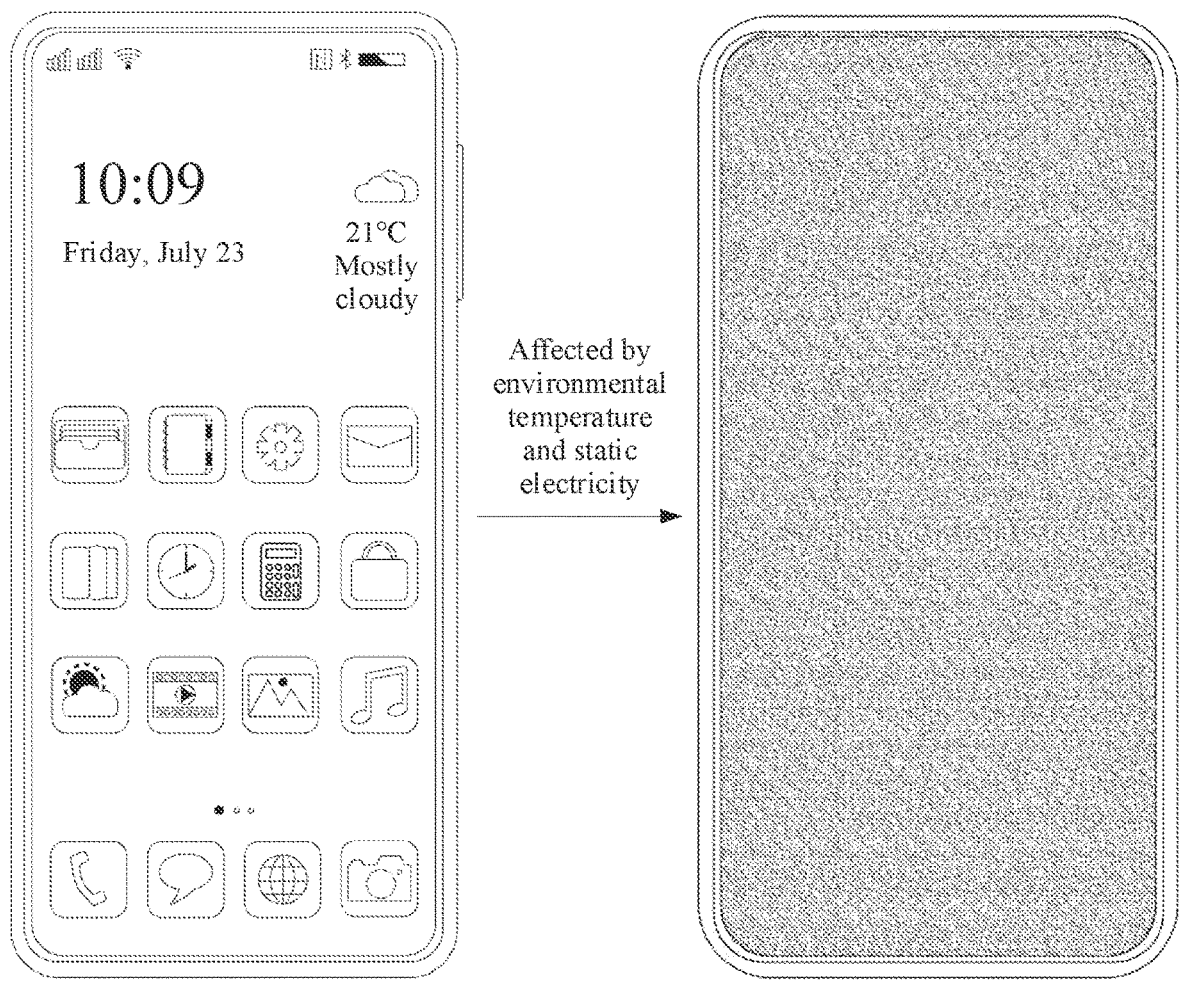
FIG. 1C is a display diagram of a display screen displaying a grainy screen.

With reference to the example displayed in FIG. 1B, a scan signal, for example, a right level signal, output by the GoA unit 1 includes two high level signals. In this case, each GoA unit in the gate driver on array circuit outputs a scan signal that includes two high level signals. When the scan signal output by the GoA unit is of a high level, a gate line corresponding to the GoA unit is driven to be started. When each GoA unit outputs two high level signals, at least two gate lines are driven to be started at the same moment. As a result, serial displaying is caused, the display screen cannot perform displaying normally, and a grainy screen is displayed, as an example shown in FIG. 1C.

Based on this, this application provides a display screen, used in an electronic device. The electronic device may be a mobile phone, a tablet computer, a desktop computer, a laptop computer, a notebook computer, an ultra-mobile personal computer (UMPC), a handheld computer, a netbook, a personal digital assistant (PDA), a wearable electronic device, a smart watch, or another device.

Figure 2:
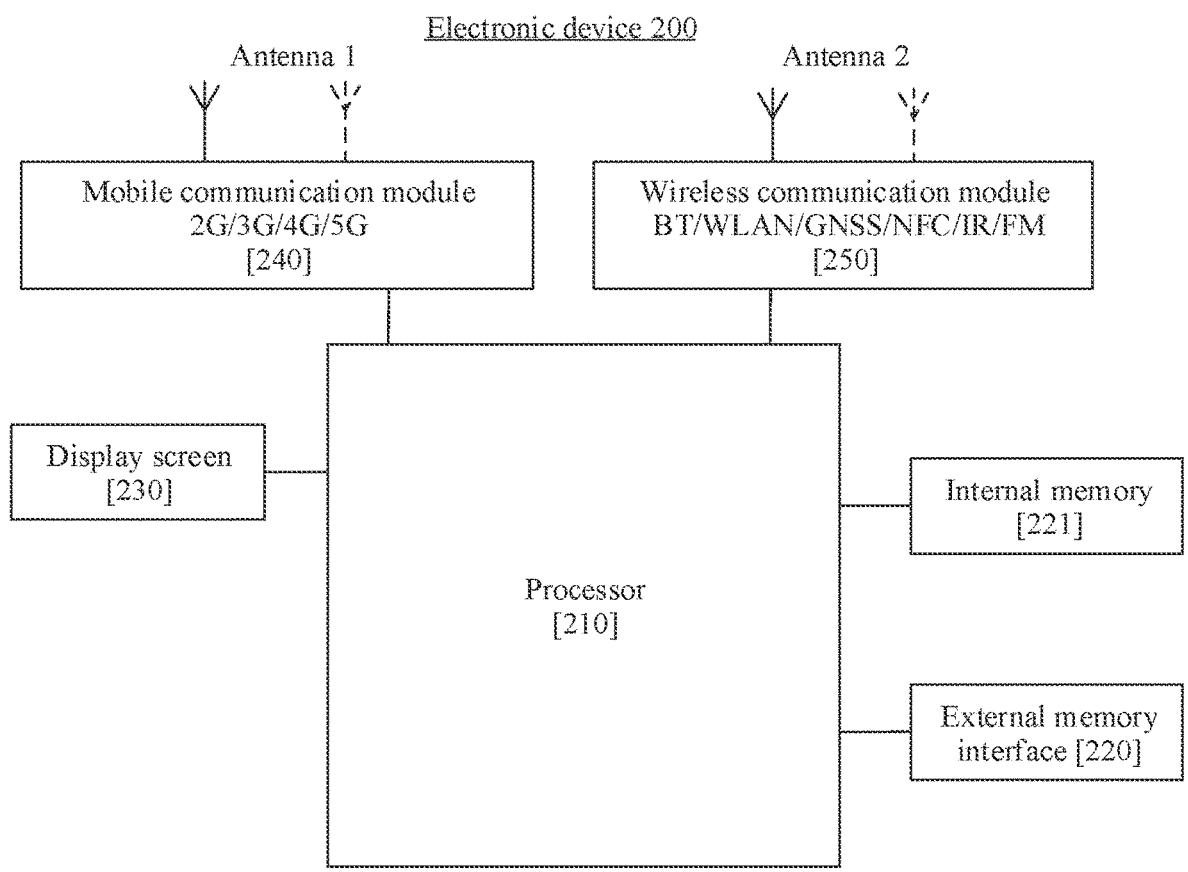
FIG. 2 is a diagram of a hardware structure of an electronic device according to this application.

For example, the electronic device is a mobile phone. An example structure of the electronic device may be as shown in FIG. 2. The electronic device 200 may include a processor 210, an external memory interface 220, an internal memory 221, a display screen 230, an antenna 1, an antenna 2, a mobile communication module 240, a wireless communication module 250, and the like.

It may be understood that a structure illustrated in an embodiment of this application does not constitute a specific limitation on the electronic device 200. In some other embodiments of this application, the electronic device 200 may include more or fewer components than those shown in the figure, or some components may be combined, or some components may be split, or different component arrangements may be used. The components shown in the figure may be implemented by using hardware, software, or a combination of software and hardware.

An interface connection relationship between the modules illustrated in this embodiment of this application is merely a schematic description, and does not constitute a limitation on the structure of the electronic device 200. In some other embodiments of this application, the electronic device 200 may alternatively use an interface connection manner different from that in the foregoing embodiment, or use a combination of a plurality of interface connection manners.

The processor 210 may include one or more processing units. For example, the processor 210 may include an application processor (AP), a modem processor, a graphics processing unit (GPU), an image signal processor (ISP), a controller, a memory, a video codec, a digital signal processor (DSP), a baseband processor, a neural-network processing unit (NPU), and/or the like. Different processing units may be independent components, or may be integrated into one or more processors. The processor may be a nerve center and a command center of the electronic device 200. The processor may generate an operation control signal based on instruction operation code and a time sequence signal, to complete control of instruction reading and instruction execution.

The processor 210 may further be provided with a memory, configured to store instructions and data. In some embodiments, the memory of the processor 210 is a cache. The memory may store instructions or data that has just been used or used repeatedly by the processor 210. If the processor 210 needs to use the instructions or data again, the processor may directly invoke the instructions or data from the memory. This avoids repeated access and reduces a waiting time of the processor 210, thereby improving efficiency of a system.

The internal memory 221 may be configured to store computer executable program code, where the executable program code includes instructions. The processor 210 implements various functional application and data processing of the electronic device 200 by running the instructions stored in the internal memory 221. The internal memory 221 may include a program storage area and a data storage area. The program storage area may store an operating system, an application required by at least one function (for example, a sound playing function and an image playing function), and the like. The data storage area may store data (for example, audio data and a phone book) created during use of the electronic device 200. In addition, the internal memory 221 may include a high-speed random access memory, and may further include a non-volatile memory, for example, at least one magnetic disk storage component, a flash memory component, or universal flash storage (UFS).

The electronic device 202 implements a display function by using the GPU, the display screen 230, the application processor, and the like. The GPU is a microprocessor for image processing, and is connected to the display screen 230 and the application processor. The GPU is configured to perform mathematical and geometric calculation, and is used for graphics rendering. The processor 210 may include one or more GPUs configured to execute program instructions to generate or change display information.

The display screen 230 is configured to display an image, a video, and the like.

Embodiment 1

An embodiment of this application provides a display screen that can be used in the foregoing electronic device.

Figure 3A:
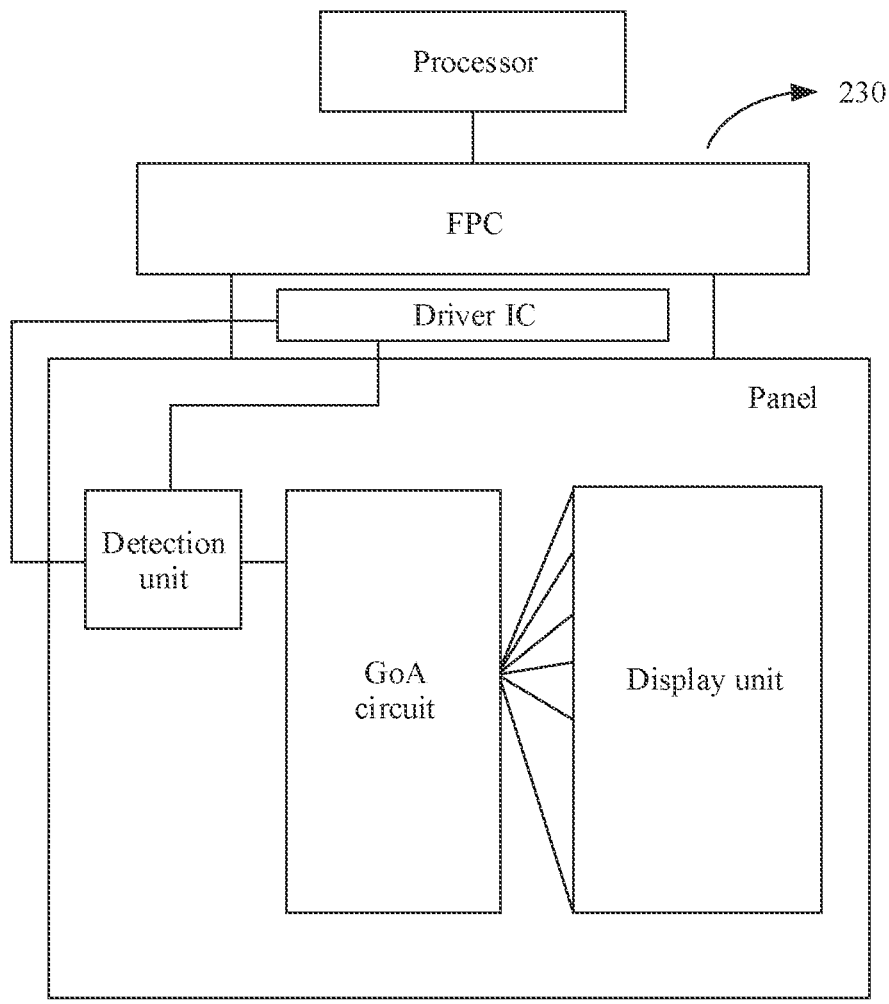
FIG. 3A is a schematic diagram of a structure of a display screen according to Embodiment 1 of this application.

With reference to FIG. 3A, the display screen 230 provided in this embodiment includes a circuit board FPC, a display screen control module driver IC packaged by a COP, and a display panel panel. The display panel panel may be a liquid crystal display (LCD), an organic light-emitting diode (OLED), an active-matrix organic light emitting diode (AMOLED), a flexible light-emitting diode (FLED), a mini-LED, a micro-LED, a micro-OLED, a quantum dot light emitting diode (QLED), or the like.

In some embodiments, the electronic device may include 1 or N display screens 230, where N is a positive integer greater than 1.

The display panel panel includes a display unit, a gate driver on array circuit, and a detection unit. The gate driver on array circuit is configured to: generate a scan signal, and drive, by using the scan signal, the display unit to perform displaying. The detection unit is configured to: detect whether the gate driver on array circuit drives a plurality of gate lines simultaneously while outputting a scan signal; and obtain a feedback signal based on a detection result. The feedback signal obtained by the detection unit is provided for the driver IC. The driver IC may determine, based on the feedback signal transmitted by the detection unit, whether the gate driver on array circuit has a problem that a plurality of gate lines are started simultaneously while a scan signal is output.

Figure 3B:
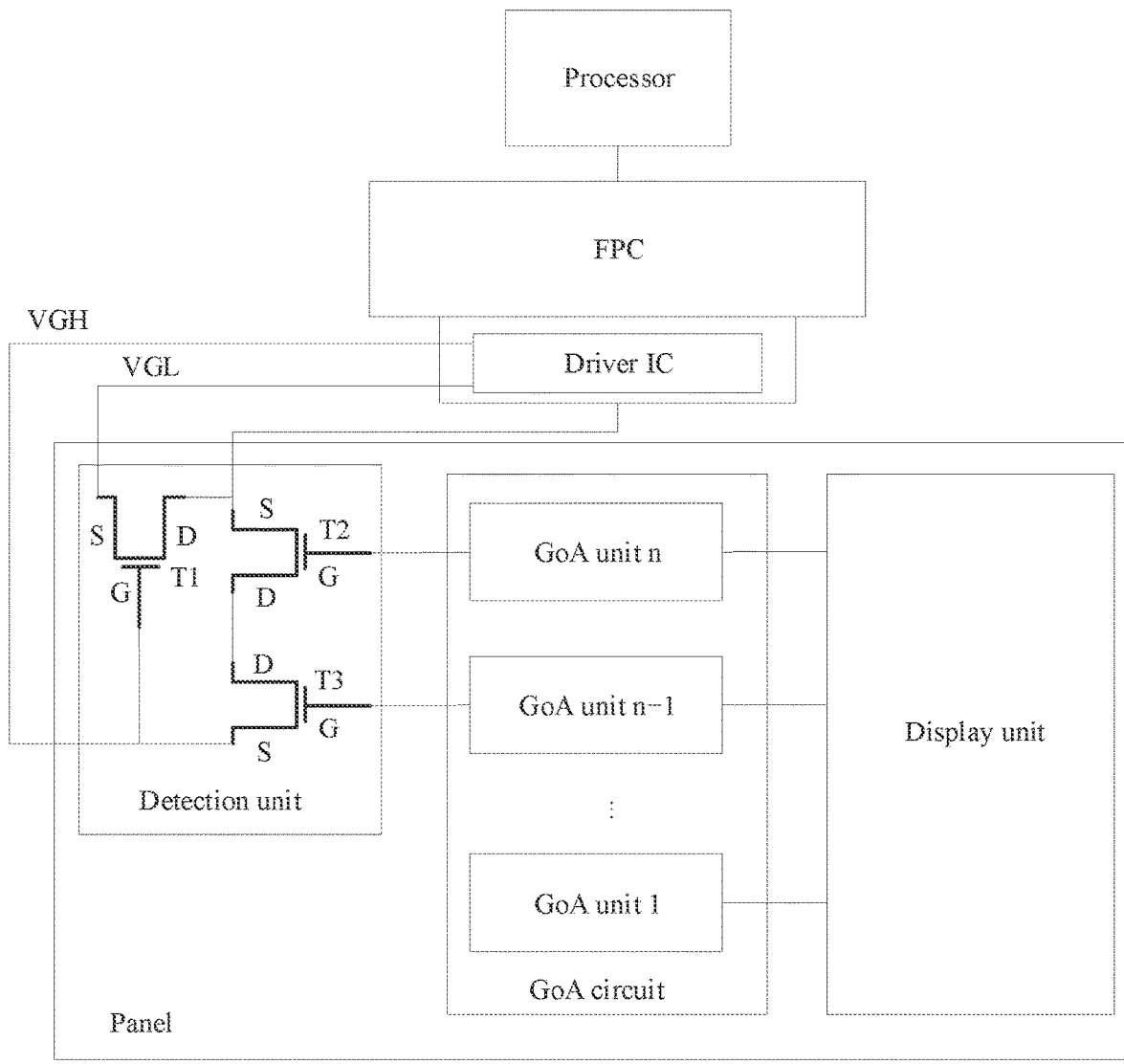
FIG. 3B is a schematic diagram of another structure of a display screen according to Embodiment 1 of this application.

With reference to FIG. 3B, the gate driver on array circuit includes a plurality of GoA units. Each GoA unit includes a plurality of thin film transistors TFTs that are connected to one another. Each GoA unit corresponds to a gate line of the display unit. A scan signal generated by the GoA unit acts on the corresponding gate line. In some embodiments, the thin film transistors TFTs included in each GoA unit are N-type thin film transistors TFTs.

The detection unit includes three N-type thin film transistors TFTs that are connected to one another.

In some embodiments, a gate G of a thin film transistor T1 is connected to a first port of the driver IC: the first port is configured to output a VGH voltage: a source S of the thin film transistor T1 is connected to a second port of the driver IC: the second port is configured to output a VGL voltage; and a drain D of the thin film transistor T1 is connected to a source S of a thin film transistor T2. A connection point between the drain D of the thin film transistor T1 and the source S of the thin film transistor T2 is used as an output port of the detection unit and is configured to output the feedback signal. A gate G of the thin film transistor T2 is connected to a GoA unit n, to receive a scan signal output by the GoA unit n; and a drain D of the thin film transistor T2 is connected to a drain D of a thin film transistor T3. A gate G of the thin film transistor T3 is connected to a GoA unit n-1, to receive a scan signal output by the GoA unit n-1; and a source S of the thin film transistor T3 is connected to the first port of the driver IC, to receive the VGH voltage transmitted from the first port.

It should be noted that, the VGH voltage is a voltage provided by the driver IC for switching on the TFT in the gate driver on array circuit; and the VGL voltage is a voltage provided by the driver IC for switching off the TFT in the gate driver on array circuit.

Figure 4A:
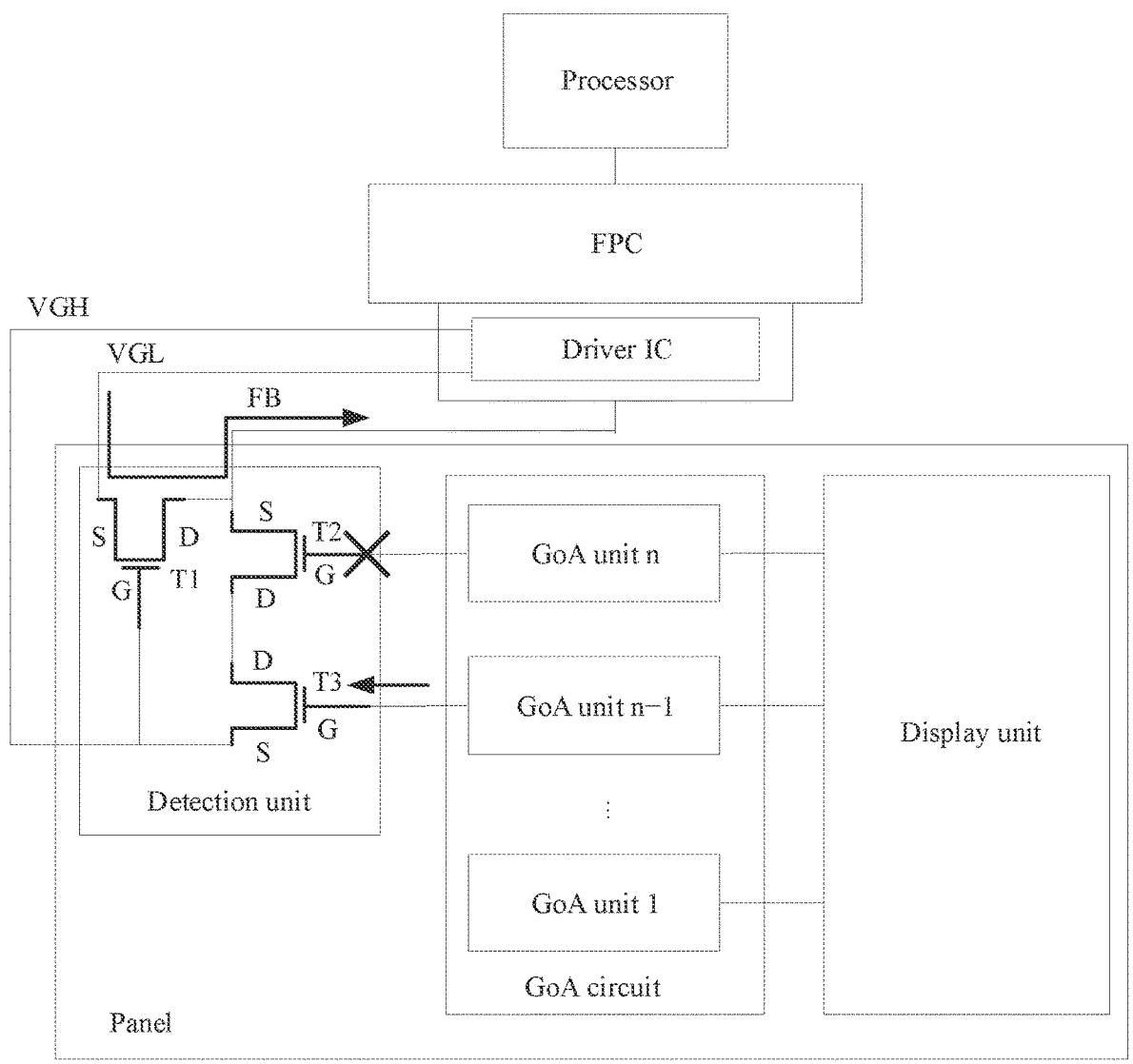
FIG. 4A is a display diagram of a running process of a detection unit according to Embodiment 1 of this application.
Figure 4B:
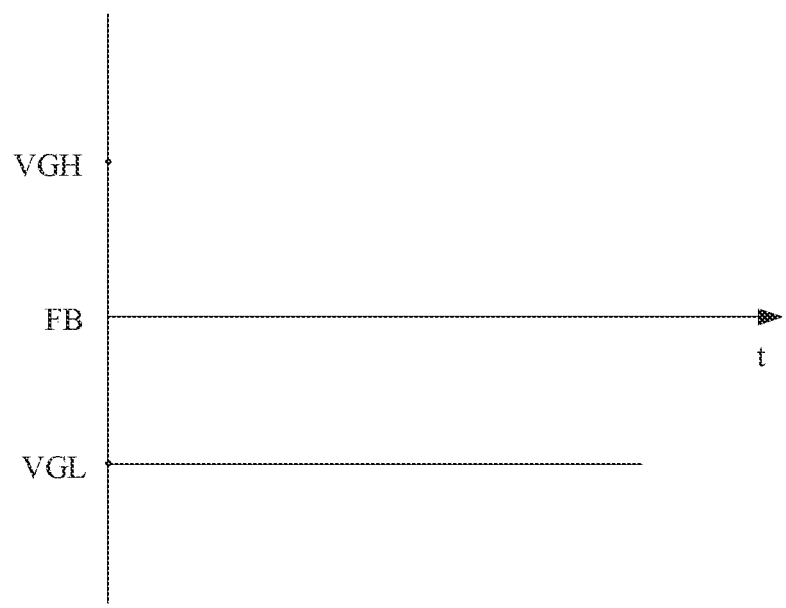
FIG. 4B is a display diagram of a feedback signal of a detection unit according to Embodiment 1 of this application.

Under conventional conditions, the GoA units of the gate driver on array circuit cannot run simultaneously, and thus do not output scan signals simultaneously. Therefore, in an example displayed in FIG. 4A, the GoA unit n-1 outputs a scan signal, and the GoA unit n does not output a scan signal. In this example, the GoA unit n-1 outputs a scan signal, and the thin film transistor T3 is switched on; and the GoA unit n does not output a scan signal, and the thin film transistor T2 is switched off. Under normal conditions, the VGH voltage is greater than the VGL voltage, and the thin film transistor T1 is switched on. Therefore, a feedback signal FB output from the output port of the detection unit is the VGL voltage, as shown in FIG. 4B.

Figure 5A:
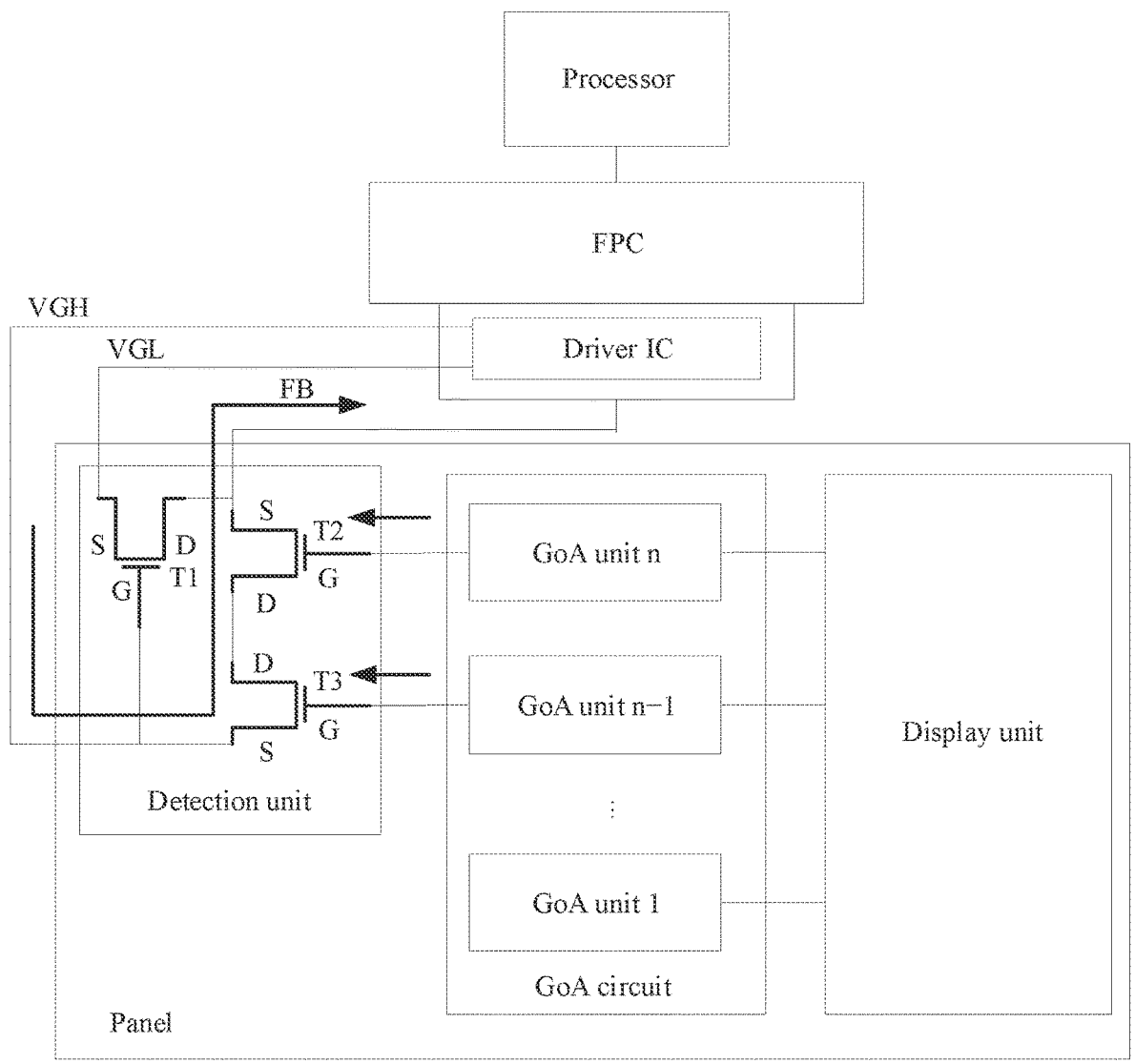
FIG. 5A is another display diagram of a running process of a detection unit according to Embodiment 1 of this application.

If two GoA units of the gate driver on array circuit run simultaneously, the GoA unit n-1 and the GoA unit n run and output scan signals simultaneously in a period of time, as an example displayed in FIG. 5A. Both the GoA unit n-1 and the GoA unit n output scan signals; and both the thin film transistor T2 and the thin film transistor T3 are switched on.

Figure 5B:
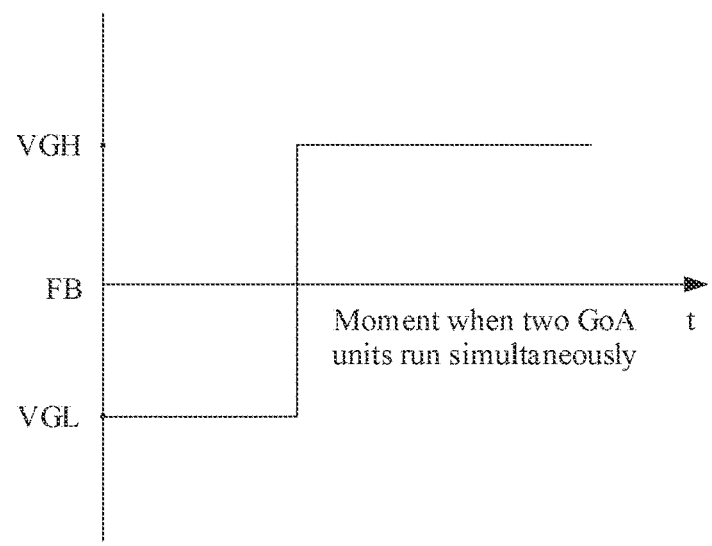
FIG. 5B is another display diagram of a feedback signal of a detection unit according to Embodiment 1 of this application.

It should be also noted that, a driving capability of the thin film transistor T1 is relatively weak and is weaker than those of the thin film transistor T2 and the thin film transistor T3. Therefore, the VGH voltage is greater than the VGL voltage, and the thin film transistor T1 is switched on. However, because the driving capability of the thin film transistor T1 is weaker than those of the thin film transistor T2 and the thin film transistor T3, the feedback signal FB output from the output port of the detection unit is jumped from the VGL voltage to the VGH voltage from a moment when two GoA units of the gate driver on array circuit run simultaneously, as shown in FIG. 5B.

In some embodiments, a length-width ratio and a size of the thin film transistor T1 are set to be relatively small, so that the driving capability of the thin film transistor T1 is relatively weak. The driving capabilities of the thin film transistor T2 and the thin film transistor T3 can be set to be greater than that of the thin film transistor T1 by designing sizes of the thin film transistor T2 and the thin film transistor T3 to be greater than that of the thin film transistor T1, designing length-width ratios of the thin film transistor T2 and the thin film transistor T3 to be greater than that of the thin film transistor T1, and so on.

In this embodiment, the driver IC receives the feedback signal transmitted by the detection unit, and may determine, based on the feedback signal, whether the gate driver on array circuit has the problem that a plurality of gate lines are started simultaneously while a scan signal is output. Specifically, if the feedback signal received by the driver IC is the VGL voltage, it is determined that the gate driver on array circuit does not have the problem that a plurality of gate lines are started simultaneously while a scan signal is output; and if the feedback signal received by the driver IC is the VGH voltage, it is determined that the gate driver on array circuit has the problem that a plurality of gate lines are started simultaneously while a scan signal is output. In addition, the driver IC may further determine, based on a moment when the feedback signal jumps from the VGL voltage to the VGH voltage, a moment when the gate driver on array circuit starts to have the problem that a plurality of gate lines are started simultaneously while a scan signal is output.

In some embodiments, if the driver IC determines that the gate driver on array circuit has the problem that a plurality of gate lines are started simultaneously while a scan signal is output, the driver IC may control a processor to restart, or feed back the problem to the processor, so that the processor performs an action to resolve this problem.

It can be learned from the embodiment shown in FIG. 3B that the detection unit is connected to two GoA units at a tail end of the gate driver on array circuit. In some embodiments, the detection unit may alternatively be disposed at a position corresponding to those of the two GoA units at the tail end of the gate driver on array circuit.

A reason why the detection unit is connected to the two GoA units at the tail end of the gate driver on array circuit is as follows:

As described above, from a first GoA unit (also referred to as a GoA unit 1) of the gate driver on array circuit, an output signal generated by one GoA unit is provided for its next GoA unit; and the next GoA unit generates its own scan signal based on the output signal generated by the one GoA unit and a clock signal. In this way, an output signal of one GoA unit acts on a scan signal of its next GoA unit, that is, a scan signal of one GoA unit can reflect an output signal of its previous GoA unit.

This is repeated until a scan signal output by a GoA unit at the tail end of the gate driver on array circuit can reflect output signals of all GoA units in the gate driver on array circuit, that is, the GoA unit n can reflect scan signals of the GoA unit n-1 to the GoA unit 1. Therefore, whether scan signals output by every two GoA units in the gate driver on array circuit are simultaneously output scan signals can be determined by connecting the detection unit to the two GoA units at the tail end of the gate driver on array circuit.

It should be also noted that the display panel panel may alternatively include a plurality of detection units. One of the plurality of detection units is connected to the two GoA units at the tail end of the gate driver on array circuit; and each of the other detection units is connected to any two of the other GoA units of the gate driver on array circuit. Certainly, as shown in FIG. 3B, each detection unit includes three N-type thin film transistors TFTs that are connected to one another.

Embodiment 2

Another embodiment of this application further provides a display screen that can also be used in the foregoing electronic device.

Figure 6A:
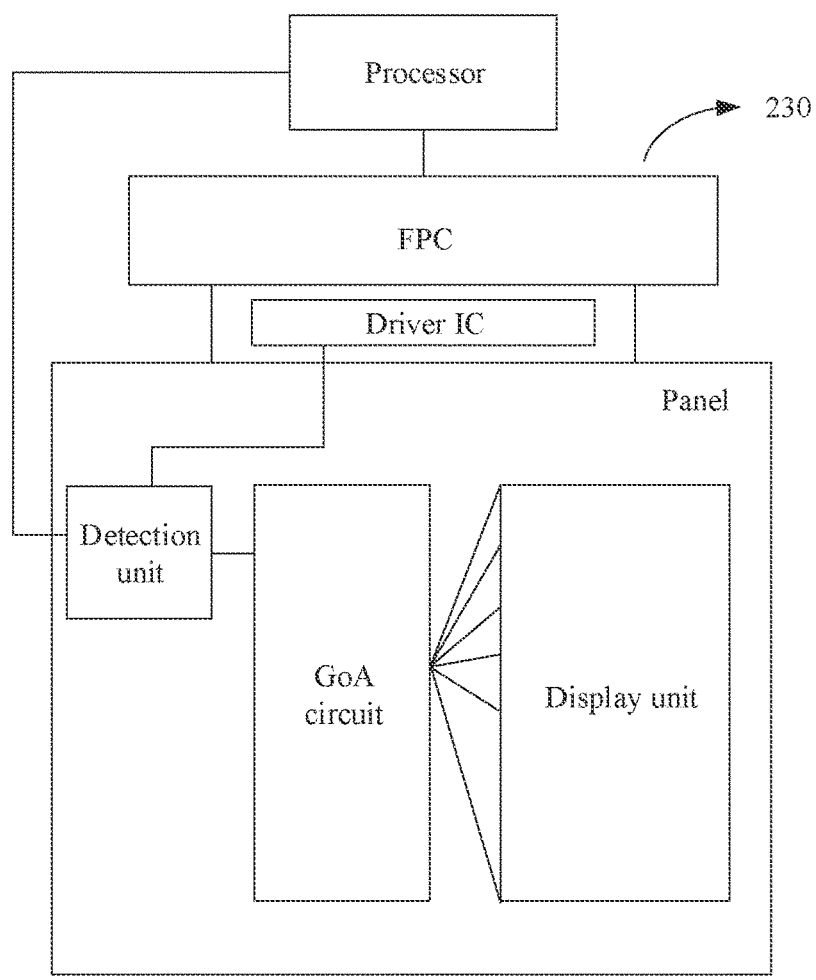
FIG. 6A is a schematic diagram of a structure of a display screen according to Embodiment 2 of this application.

With reference to FIG. 6A, the display screen 230 provided in this embodiment also includes a circuit board FPC, a display screen control module driver IC packaged by a COP, and a display panel panel. The display panel panel may be a liquid crystal display (LCD), an organic light-emitting diode (OLED), an active-matrix organic light emitting diode (AMOLED), a flexible light-emitting diode (FLED), a mini-LED, a micro-LED, a micro-OLED, a quantum dot light emitting diode (QLED), or the like.

In some embodiments, the electronic device may also include 1 or N display screens 230, where N is a positive integer greater than 1.

In this embodiment, the display panel panel includes a display unit, a gate driver on array circuit, and a detection unit. Structures and functions of the display unit and the gate driver on array circuit are the same as those of the display unit and the gate driver on array circuit in Embodiment 1. In this embodiment, the detection unit is connected to a processor: a feedback signal obtained by the detection unit is provided for the processor; and the processor may determine, based on the feedback signal transmitted by the detection unit, whether the gate driver on array circuit has a problem that a plurality of gate lines are started simultaneously while a scan signal is output.

Figure 6B:
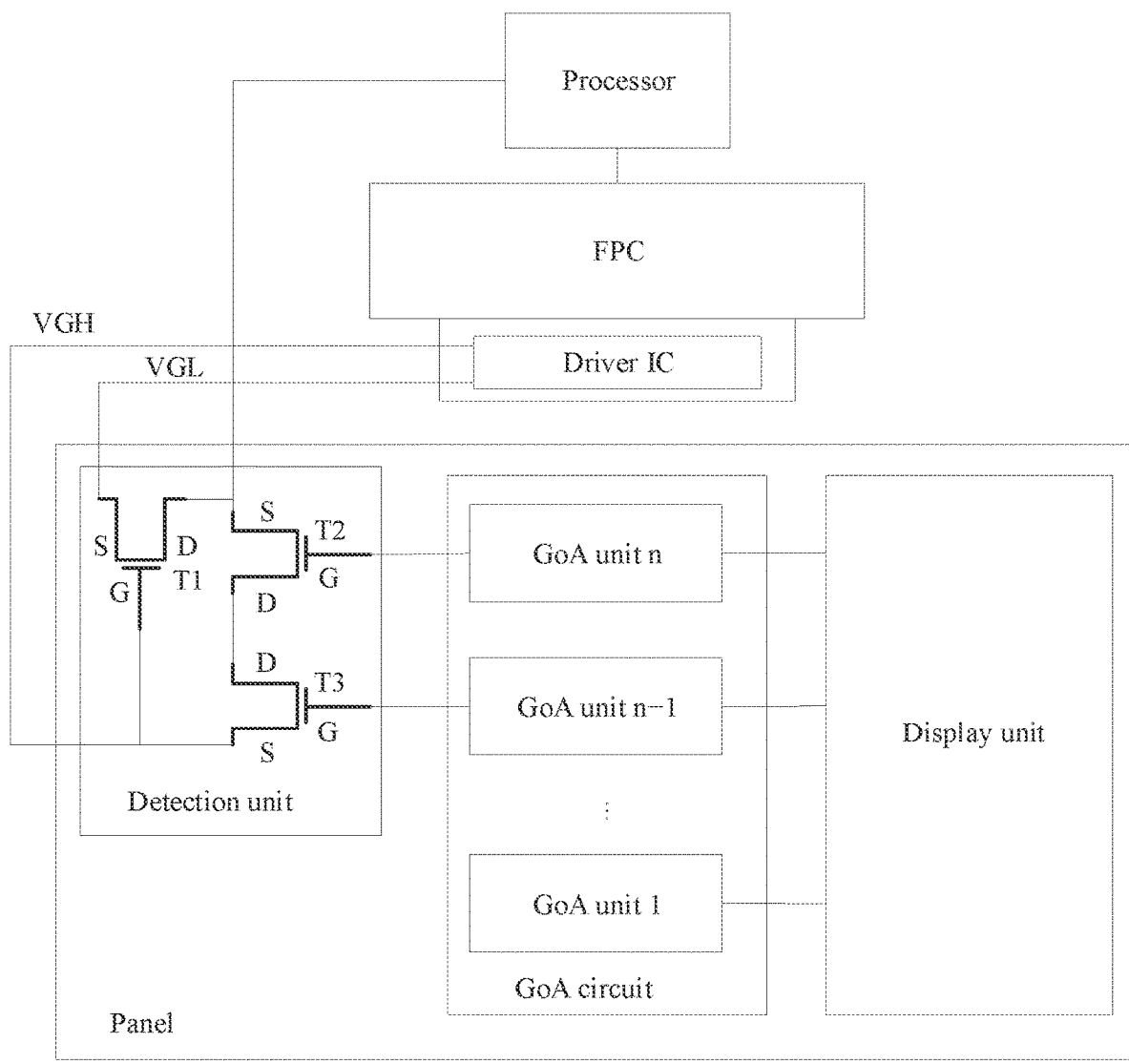
FIG. 6B is a schematic diagram of another structure of a display screen according to Embodiment 2 of this application.

With reference to FIG. 6B, the detection unit includes three N-type thin film transistors TFTs that are connected to one another.

In some embodiments, a gate G of a thin film transistor T1 is connected to a first port of the driver IC: the first port is configured to output a VGH voltage: a source S of the thin film transistor T1 is connected to a second port of the driver IC: the second port is configured to output a VGL voltage; and a drain D of the thin film transistor T1 is connected to a source S of a thin film transistor T2. A connection point between the drain D of the thin film transistor T1 and the source S of the thin film transistor T2 is used as an output port of the detection unit, is connected to the processor, and is configured to transmit the feedback signal to the processor. A gate G of the thin film transistor T2 is connected to a GoA unit n, to receive a scan signal output by the GoA unit n; and a drain D of the thin film transistor T2 is connected to a drain D of a thin film transistor T3. A gate G of the thin film transistor T3 is connected to a GoA unit n-1, to receive a scan signal output by the GoA unit n-1; and a source S of the thin film transistor T3 is connected to the first port of the driver IC, to receive the VGH voltage transmitted from the first port.

It should be noted that, functions of the VGH voltage and the VGL voltage are the same as those of the VGH voltage and the VGL voltage in Embodiment 1.

Figure 7A:
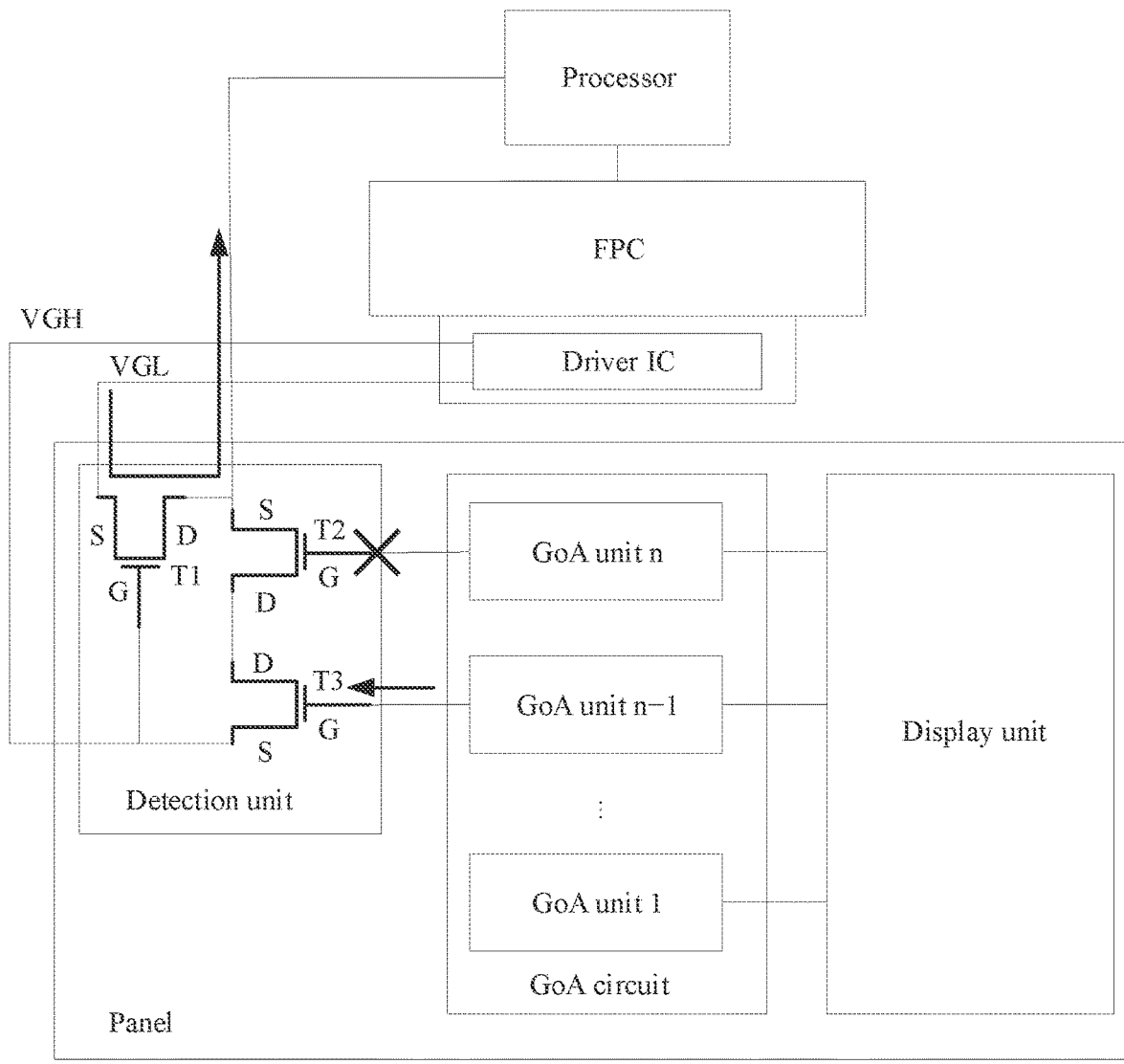
FIG. 7A is a display diagram of a running process of a detection unit according to Embodiment 2 of this application.

The same as the description of Embodiment 1, under conventional conditions, in an example displayed in FIG. 7A, the GoA unit n-1 outputs a scan signal, and the GoA unit n does not output a scan signal. The GoA unit n-1 outputs a scan signal, and the thin film transistor T3 is switched on; and the GoA unit n does not output a scan signal, and the thin film transistor T2 is switched off. The thin film transistor T1 is switched on. Therefore, a feedback signal FB output from the output port of the detection unit is the VGL voltage.

Figure 7B:
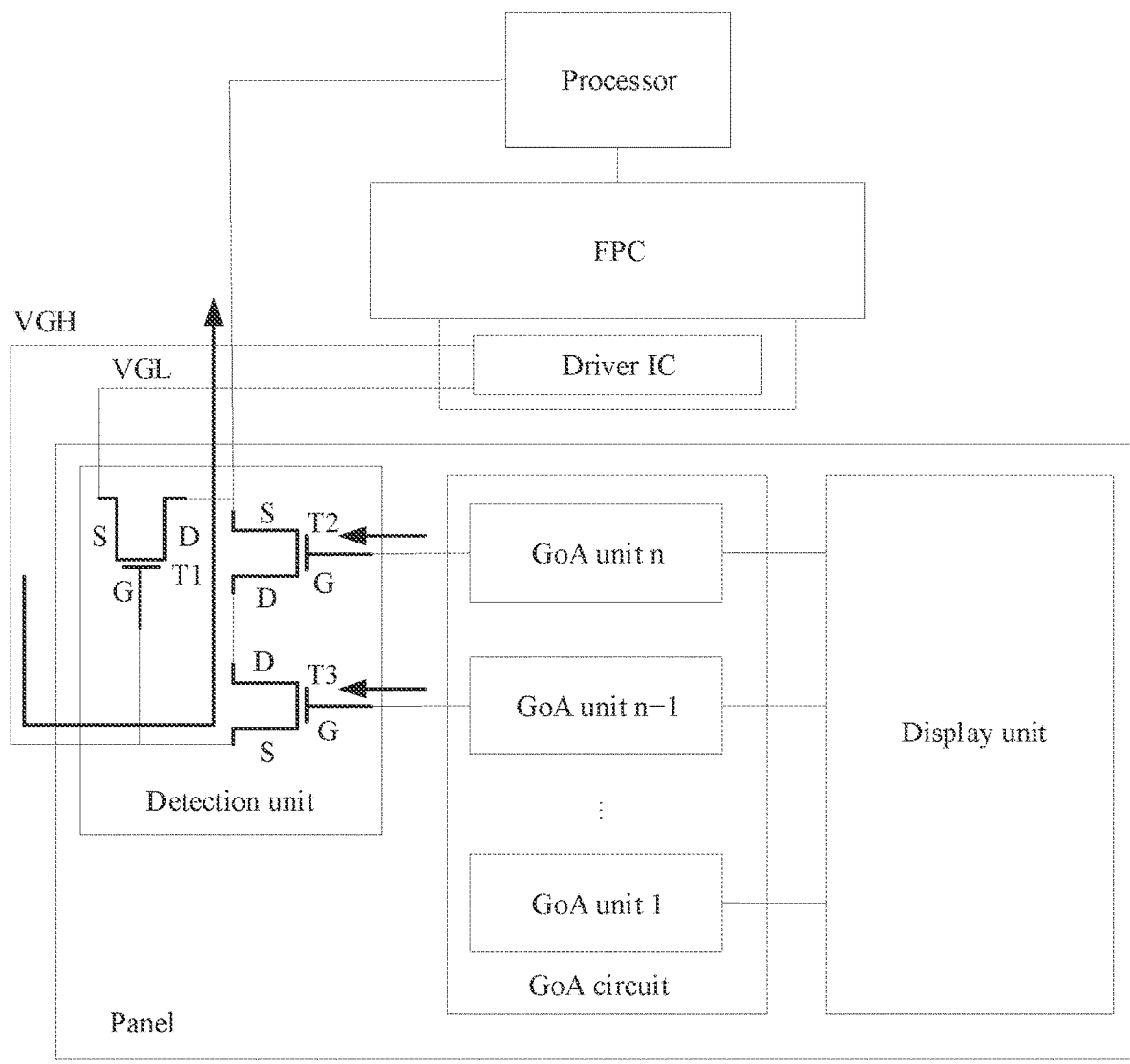
FIG. 7B is another display diagram of a running process of a detection unit according to Embodiment 2 of this application.

If two GoA units of the gate driver on array circuit run simultaneously, the GoA unit n-1 and the GoA unit n run and output scan signals simultaneously in a period of time, as an example displayed in FIG. 7B. Both the GoA unit n-1 and the GoA unit n output scan signals; and both the thin film transistor T2 and the thin film transistor T3 are switched on.

Similarly, a driving capability of the thin film transistor T1 is weaker than those of the thin film transistor T2 and the thin film transistor T3. Therefore, even if the thin film transistor T1 is switched on, the feedback signal FB output from the output port of the detection unit is also jumped from the VGL voltage to the VGH voltage from a moment when two GoA units of the gate driver on array circuit run simultaneously.

In some embodiments, a length-width ratio and a size of the thin film transistor T1 are set to be relatively small, so that the driving capability of the thin film transistor T1 is relatively weak. The driving capabilities of the thin film transistor T2 and the thin film transistor T3 can be set to be greater than that of the thin film transistor T1 by designing sizes of the thin film transistor T2 and the thin film transistor T3 to be greater than that of the thin film transistor T1, designing length-width ratios of the thin film transistor T2 and the thin film transistor T3 to be greater than that of the thin film transistor T1, and so on.

In this embodiment, the processor receives the feedback signal transmitted by the detection unit, and may determine, based on the feedback signal, whether the gate driver on array circuit has the problem that a plurality of gate lines are started simultaneously while a scan signal is output. Specifically, if the feedback signal received by the processor is the VGL voltage, it is determined that the gate driver on array circuit does not have the problem that a plurality of gate lines are started simultaneously while a scan signal is output. If the feedback signal received by the processor is the VGH voltage, it is determined that the gate driver on array circuit has the problem that a plurality of gate lines are started simultaneously while a scan signal is output. In addition, the processor may further determine, based on a moment when the feedback signal jumps from the VGL voltage to the VGH voltage, a moment when the gate driver on array circuit starts to have the problem that a plurality of gate lines are started simultaneously while a scan signal is output.

In some embodiments, if the processor determines that the gate driver on array circuit has the problem that a plurality of gate lines are started simultaneously while a scan signal is output, the processor may restart or perform another action to resolve this problem.

It should be also noted that, in Embodiment 1 and Embodiment 2 of this application, that T1, T2, and T3 in the detection unit are N-type thin film transistors is described as an example. However, in the display screen provided in this embodiment of this application, T1, T2, and T3 of the detection unit are not limited to N-type thin film transistors. In some embodiments, T1, T2, and T3 of the detection unit may be other transistors that are of a same property, such as MOS transistors and switching transistors.

Embodiment 3

In the display screen provided in the foregoing two embodiments, T1, T2, and T3 in the detection unit are N-type thin film transistors. T1, T2, and T3 in the detection unit may alternatively be P-type thin film transistors.

Figure 8:
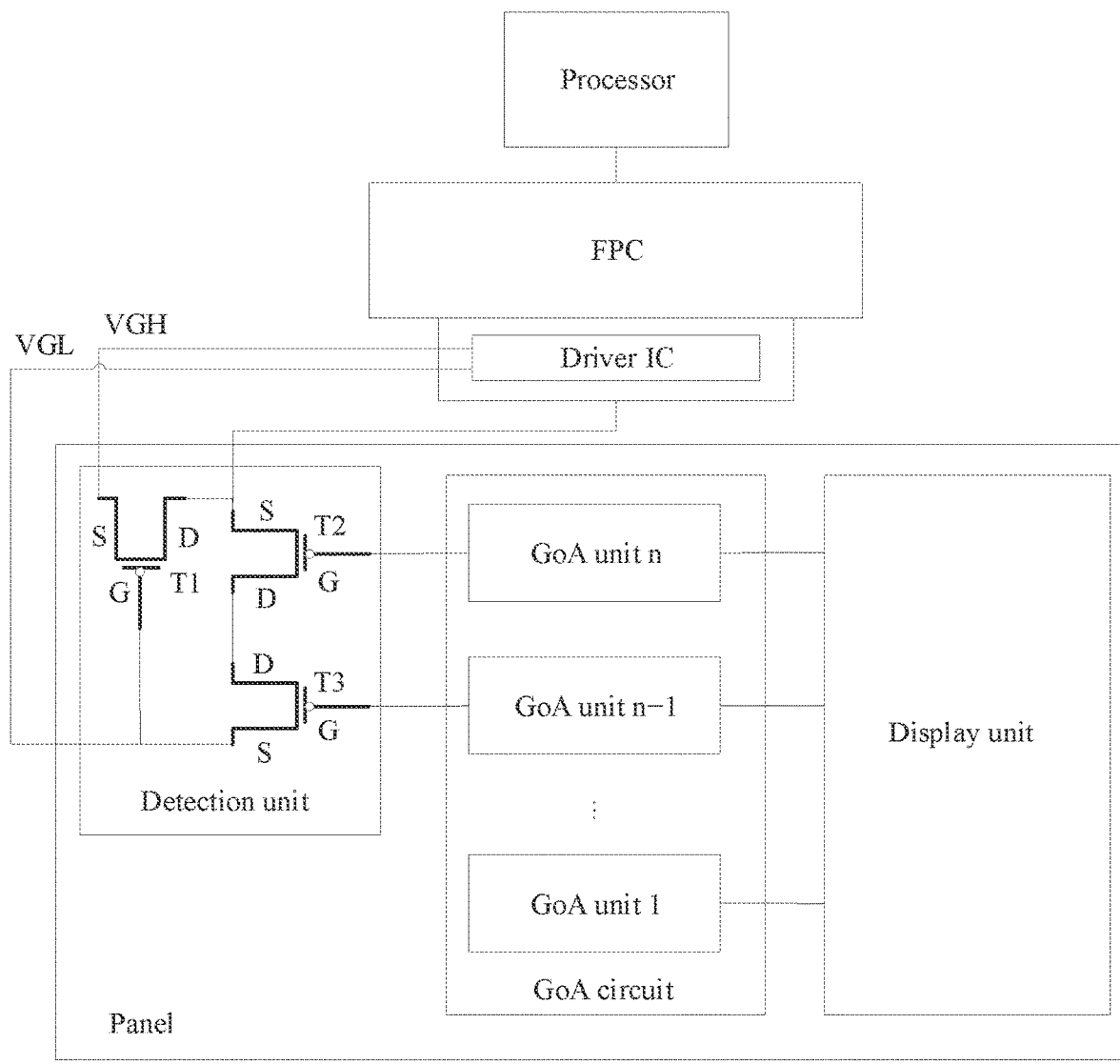
FIG. 8 is a schematic diagram of a structure of a display screen according to Embodiment 3 of this application.

Based on this, in the display screen provided in this embodiment, as shown in FIG. 8, the display panel panel includes a display unit, a gate driver on array circuit, and a detection unit. The gate driver on array circuit is configured to: generate a scan signal, and drive, by using the scan signal, the display unit to perform displaying. The detection unit is configured to: detect whether the gate driver on array circuit drives a plurality of gate lines simultaneously while outputting a scan signal; and obtain a feedback signal based on a detection result. The feedback signal obtained by the detection unit is provided for a driver IC. The driver IC may determine, based on the feedback signal transmitted by the detection unit, whether the gate driver on array circuit has a problem that a plurality of gate lines are started simultaneously while a scan signal is output.

The gate driver on array circuit includes a plurality of GoA units. Each GoA unit includes a plurality of thin film transistors TFTs that are connected to one another. Each GoA unit corresponds to a gate line of the display unit. A scan signal generated by the GoA unit acts on the corresponding gate line. In some embodiments, the thin film transistors TFTs included in each GoA unit are P-type thin film transistors TFTs.

The detection unit includes three P-type thin film transistors TFTs that are connected to one another.

In some embodiments, a gate G of a thin film transistor T1 is connected to a first port of the driver IC: the first port is configured to output a VGL voltage: a source S of the thin film transistor T1 is connected to a second port of the driver IC: the second port is configured to output a VGH voltage; and a drain D of the thin film transistor T1 is connected to a source S of a thin film transistor T2. A connection point between the drain D of the thin film transistor T1 and the source S of the thin film transistor T2 is used as an output port of the detection unit and is configured to output the feedback signal. A gate G of the thin film transistor T2 is connected to a GoA unit n, to receive a scan signal output by the GoA unit n; and a drain D of the thin film transistor T2 is connected to a drain D of a thin film transistor T3. A gate G of the thin film transistor T3 is connected to a GoA unit n-1, to receive a scan signal output by the GoA unit n-1; and a source S of the thin film transistor T3 is connected to the first port of the driver IC, to receive the VGL voltage transmitted from the first port.

It should be noted that, the VGH voltage is a voltage provided by the driver IC for switching off the TFT in the gate driver on array circuit; and the VGL voltage is a voltage provided by the driver IC for switching on the TFT in the gate driver on array circuit.

Figure 9A:
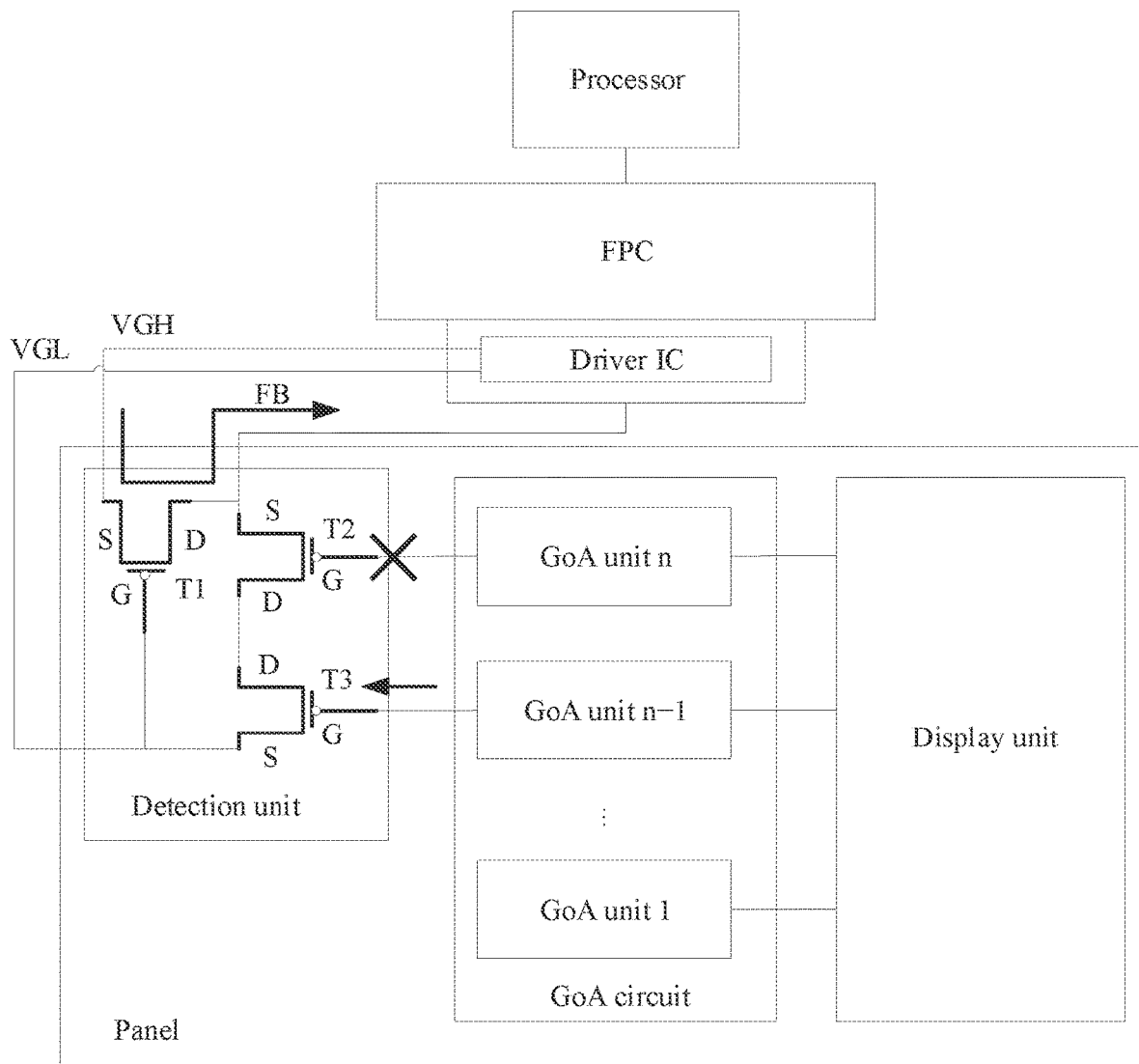
FIG. 9A is a display diagram of a running process of a detection unit according to Embodiment 3 of this application.
Figure 9B:
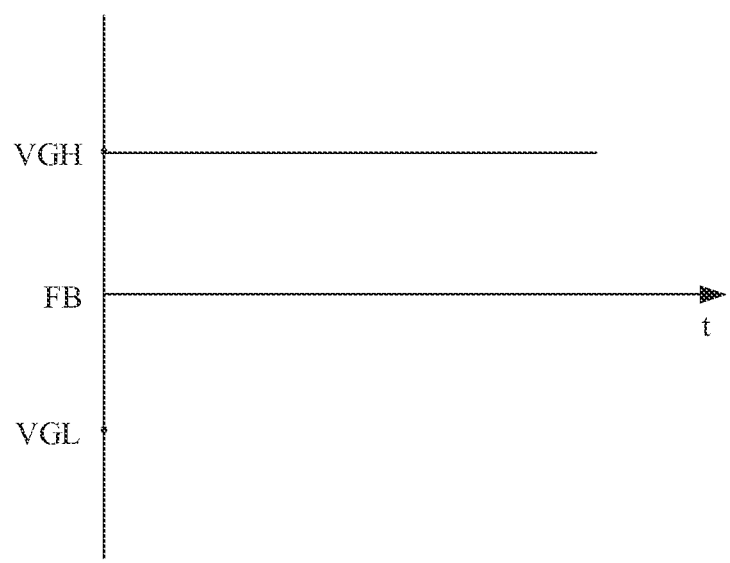
FIG. 9B is a display diagram of a feedback signal of a detection unit according to Embodiment 3 of this application.

The same as the description of Embodiment 1, the GoA units of the gate driver on array circuit cannot run simultaneously, and thus do not output scan signals simultaneously. Therefore, in an example displayed in FIG. 9A, the GoA unit n-1 outputs a scan signal, and the GoA unit n does not output a scan signal. In this example, the GoA unit n-1 outputs a scan signal, and the thin film transistor T3 is switched on; and the GoA unit n does not output a scan signal, and the thin film transistor T2 is switched off. Under normal conditions, the VGH voltage is greater than the VGL voltage: a gate-source voltage of the thin film transistor T1 is less than a switch-on voltage of the thin film transistor T1; and the thin film transistor T1 is switched on. Therefore, a feedback signal FB output from the output port of the detection unit is the VGH voltage, as shown in FIG. 9B.

Figure 10A:
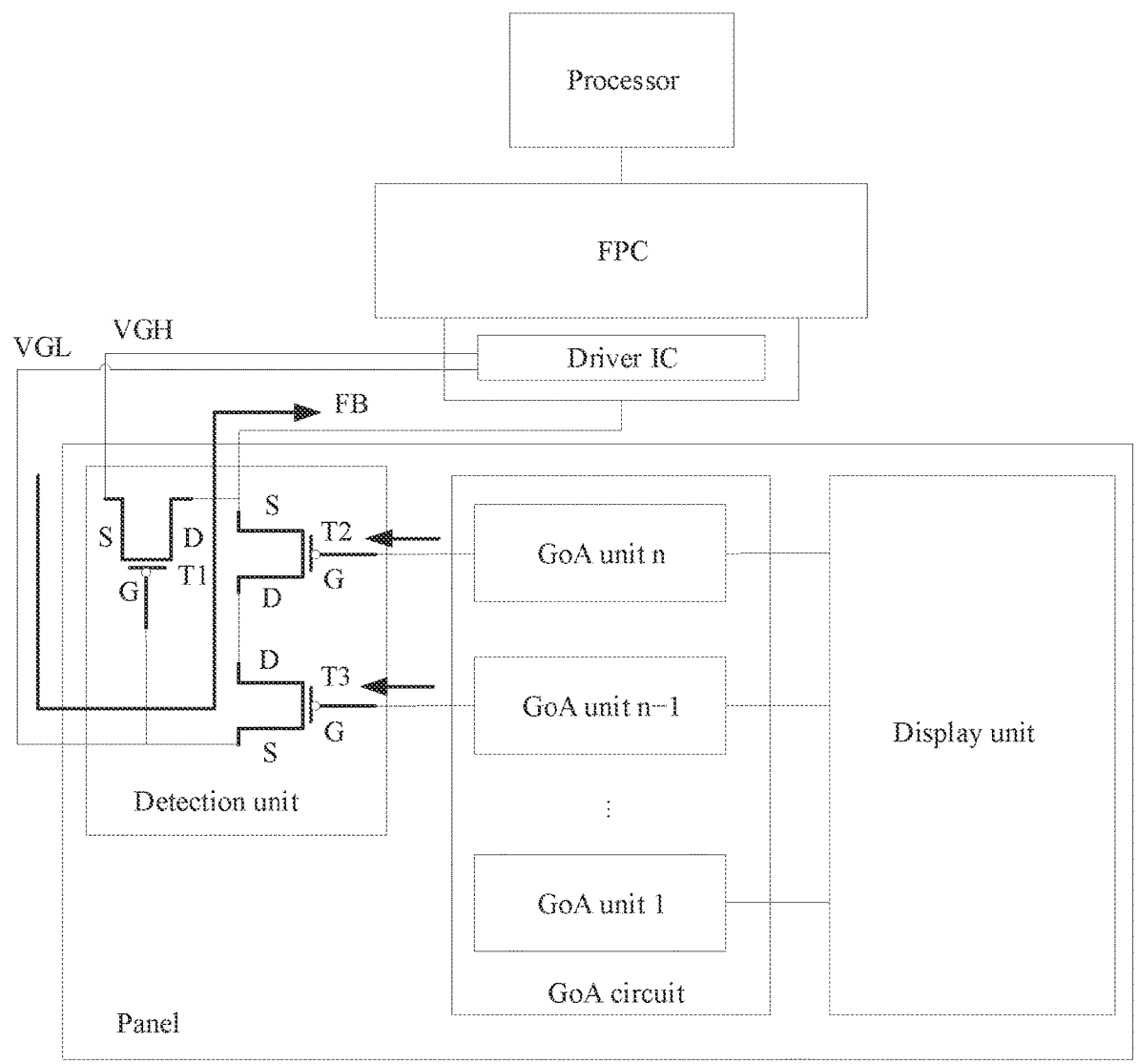
FIG. 10A is another display diagram of a running process of a detection unit according to Embodiment 3 of this application.
Figure 10B:
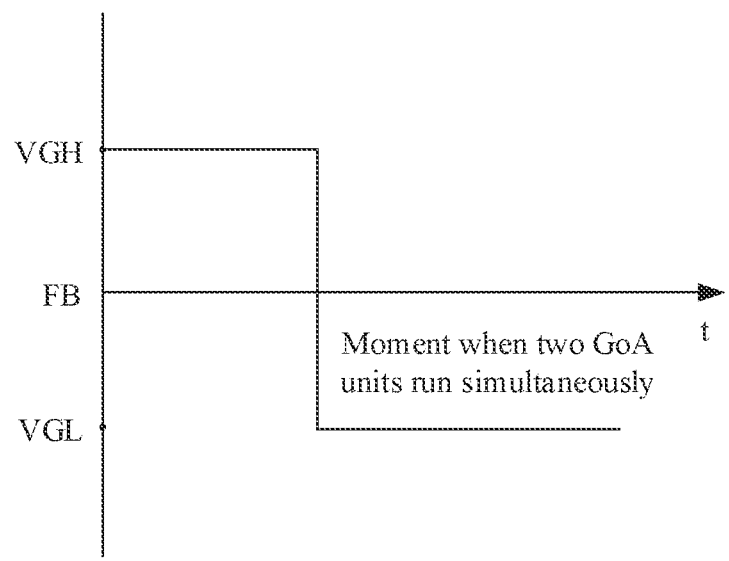
FIG. 10B is another display diagram of a feedback signal of a detection unit according to Embodiment 3 of this application.

If two GoA units of the gate driver on array circuit run simultaneously, the GoA unit n-1 and the GoA unit n run and output scan signals simultaneously in a period of time, as an example displayed in FIG. 10A. Both the GoA unit n-1 and the GoA unit n output scan signals; and both the thin film transistor T2 and the thin film transistor T3 are switched on. In addition, because a driving capability of the thin film transistor T1 is weaker than those of the thin film transistor T2 and the thin film transistor T3, the VGH voltage is greater than the VGL voltage: the thin film transistor T1 is switched on; and the feedback signal FB output from the output port of the detection unit is jumped from the VGH voltage to the VGL voltage from a moment when two GoA units of the gate driver on array circuit run simultaneously, as shown in FIG. 10B.

In some embodiments, a length-width ratio and a size of the thin film transistor T1 are set to be relatively small, so that the driving capability of the thin film transistor T1 is relatively weak. The driving capabilities of the thin film transistor T2 and the thin film transistor T3 can be set to be greater than that of the thin film transistor T1 by designing sizes of the thin film transistor T2 and the thin film transistor T3 to be greater than that of the thin film transistor T1, designing length-width ratios of the thin film transistor T2 and the thin film transistor T3 to be greater than that of the thin film transistor T1, and so on.

In this embodiment, the driver IC receives the feedback signal transmitted by the detection unit, and may determine, based on the feedback signal, whether the gate driver on array circuit has the problem that a plurality of gate lines are started simultaneously while a scan signal is output. Specifically, if the feedback signal received by the driver IC is the VGH voltage, it is determined that the gate driver on array circuit does not have the problem that a plurality of gate lines are started simultaneously while a scan signal is output. If the feedback signal received by the driver IC is the VGL voltage, it is determined that the gate driver on array circuit has the problem that a plurality of gate lines are started simultaneously while a scan signal is output. In addition, the driver IC may further determine, based on a moment when the feedback signal jumps from the VGH voltage to the VGL voltage, a moment when the gate driver on array circuit starts to have the problem that a plurality of gate lines are started simultaneously while a scan signal is output.

In some embodiments, if the driver IC determines that the gate driver on array circuit has the problem that a plurality of gate lines are started simultaneously while a scan signal is output, the driver IC may control a processor to restart, or feed back the problem to the processor, so that the processor performs an action to resolve this problem.

The same as the description of Embodiment 1, the detection unit is connected to two GoA units at a tail end of the gate driver on array circuit. Certainly, the display panel may alternatively include a plurality of detection units. One of the plurality of detection units is connected to the two GoA units at the tail end of the gate driver on array circuit; and each of the other detection units is connected to any two of the other GoA units of the gate driver on array circuit.

Embodiment 4

The same as the description of Embodiment 3, the display screen provided in this embodiment of this application and used in the foregoing electronic device includes a circuit board FPC, a display screen control module driver IC packaged by a COP, and a display panel panel.

In the display panel panel, the detection unit is connected to a processor: a feedback signal obtained by the detection unit is provided for the processor; and the processor may determine, based on the feedback signal transmitted by the detection unit, whether the gate driver on array circuit has a problem that a plurality of gate lines are started simultaneously while a scan signal is output.

Figure 11:
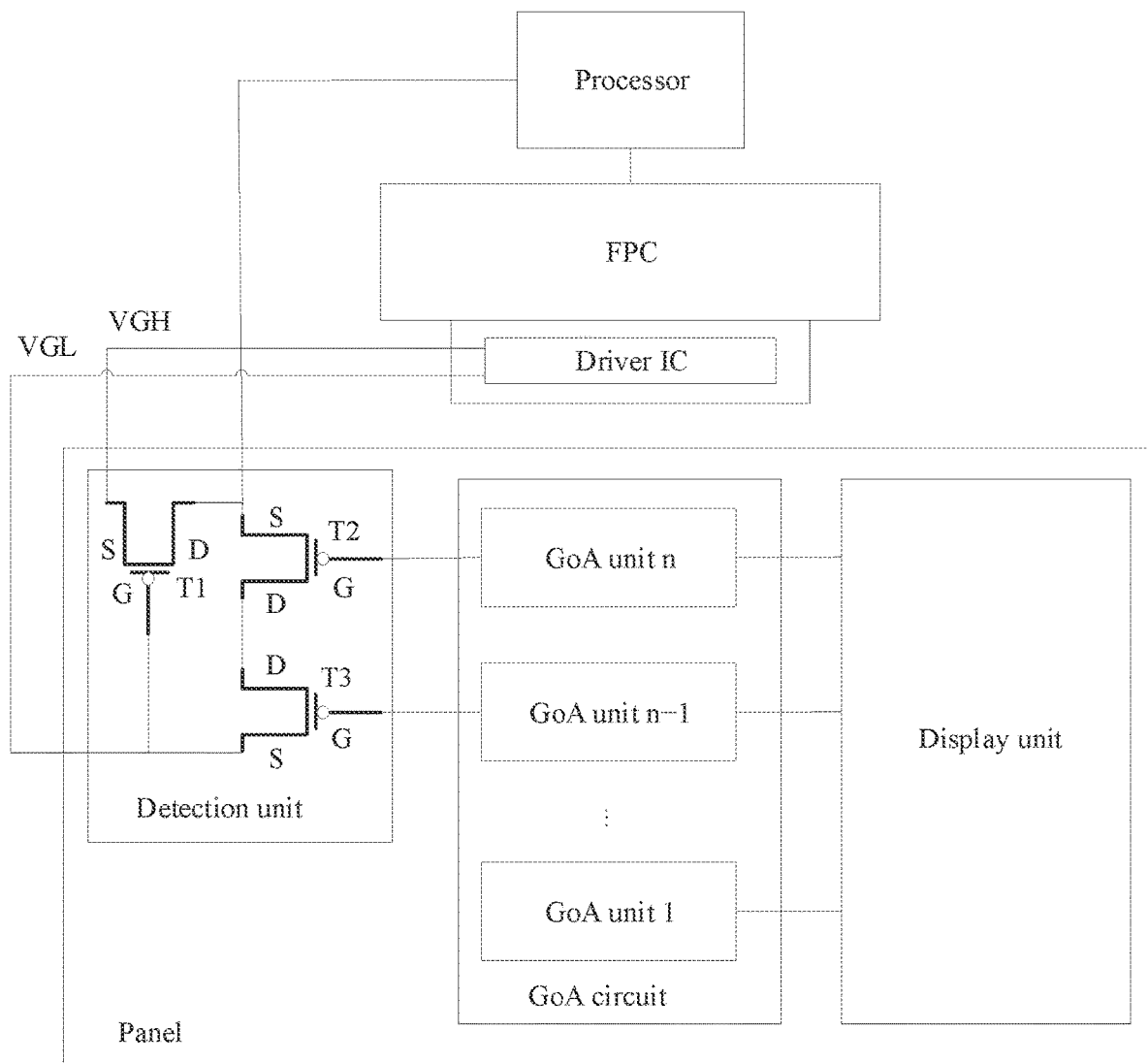
FIG. 11 is a schematic diagram of a structure of a display screen according to Embodiment 4 of this application.

Specifically, with reference to FIG. 11, the detection unit includes three P-type thin film transistors TFTs that are connected to one another. In some embodiments, a gate G of a thin film transistor T1 is connected to a first port of the driver IC: the first port is configured to output a VGL voltage: a source S of the thin film transistor T1 is connected to a second port of the driver IC: the second port is configured to output a VGH voltage; and a drain D of the thin film transistor T1 is connected to a source S of a thin film transistor T2. A connection point between the drain D of the thin film transistor T1 and the source S of the thin film transistor T2 is used as an output port of the detection unit and is configured to output the feedback signal to the processor. A gate G of the thin film transistor T2 is connected to a GoA unit n, to receive a scan signal output by the GoA unit n; and a drain D of the thin film transistor T2 is connected to a drain D of a thin film transistor T3. A gate G of the thin film transistor T3 is connected to a GoA unit n-1, to receive a scan signal output by the GoA unit n-1; and a source S of the thin film transistor T3 is connected to the first port of the driver IC, to receive the VGL voltage transmitted from the first port.

It should be noted that, functions of the VGH voltage and the VGL voltage are the same as those of the VGH voltage and the VGL voltage in Embodiment 3.

Figure 12A:
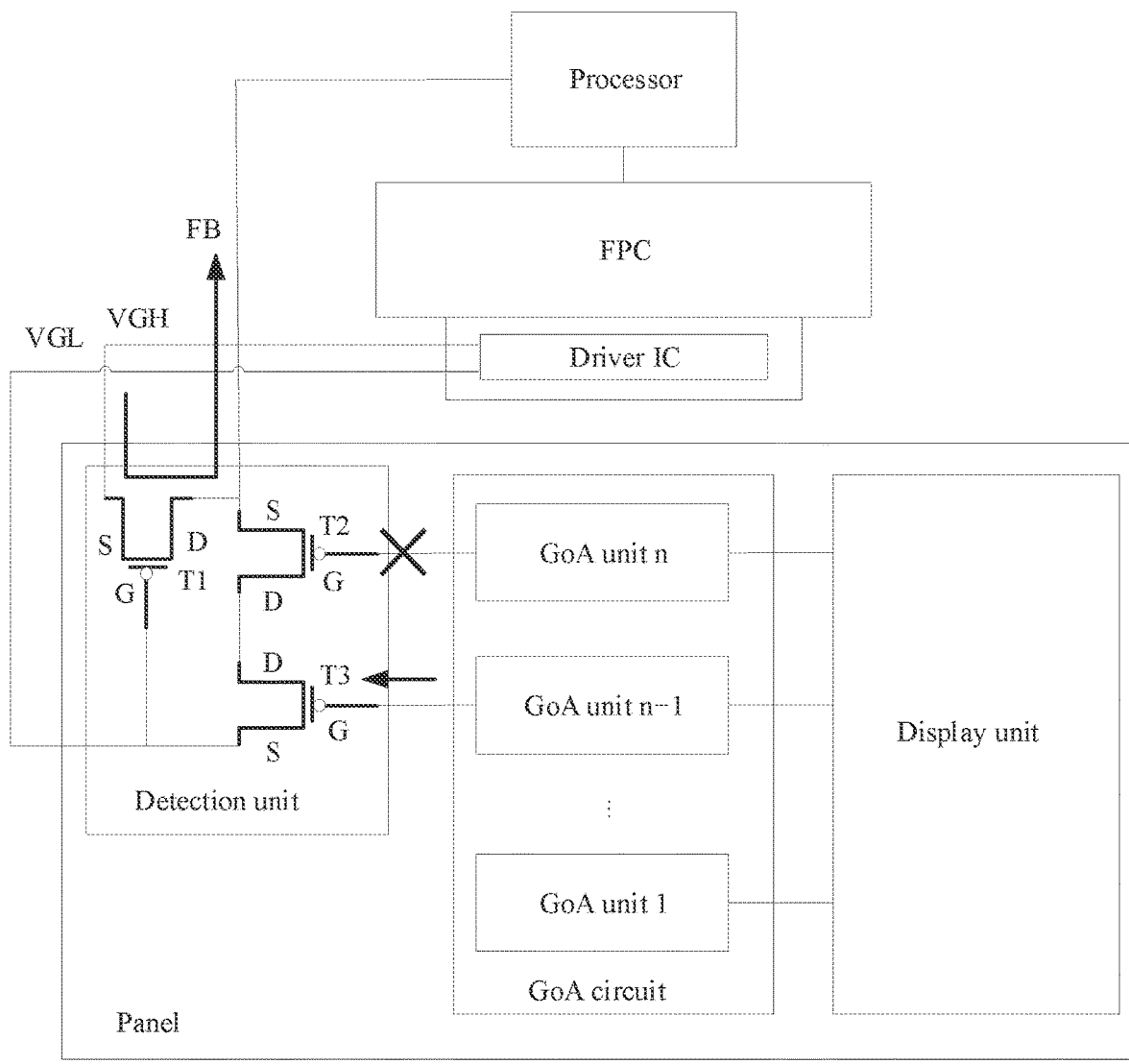
FIG. 12A is a display diagram of a running process of a detection unit according to Embodiment 4 of this application.

The same as the description of Embodiment 3, the GoA units of the gate driver on array circuit cannot run simultaneously, and thus do not output scan signals simultaneously. Therefore, in an example displayed in FIG. 12A, the GoA unit n-1 outputs a scan signal, and the GoA unit n does not output a scan signal. In this example, the GoA unit n-1 outputs a scan signal, and the thin film transistor T3 is switched on; and the GoA unit n does not output a scan signal, and the thin film transistor T2 is switched off. Under normal conditions, the VGH voltage is greater than the VGL voltage: a gate-source voltage of the thin film transistor T1 is less than a switch-on voltage of the thin film transistor T1; and the thin film transistor T1 is switched on. Therefore, a feedback signal FB output from the output port of the detection unit is the VGH voltage.

Figure 12B:
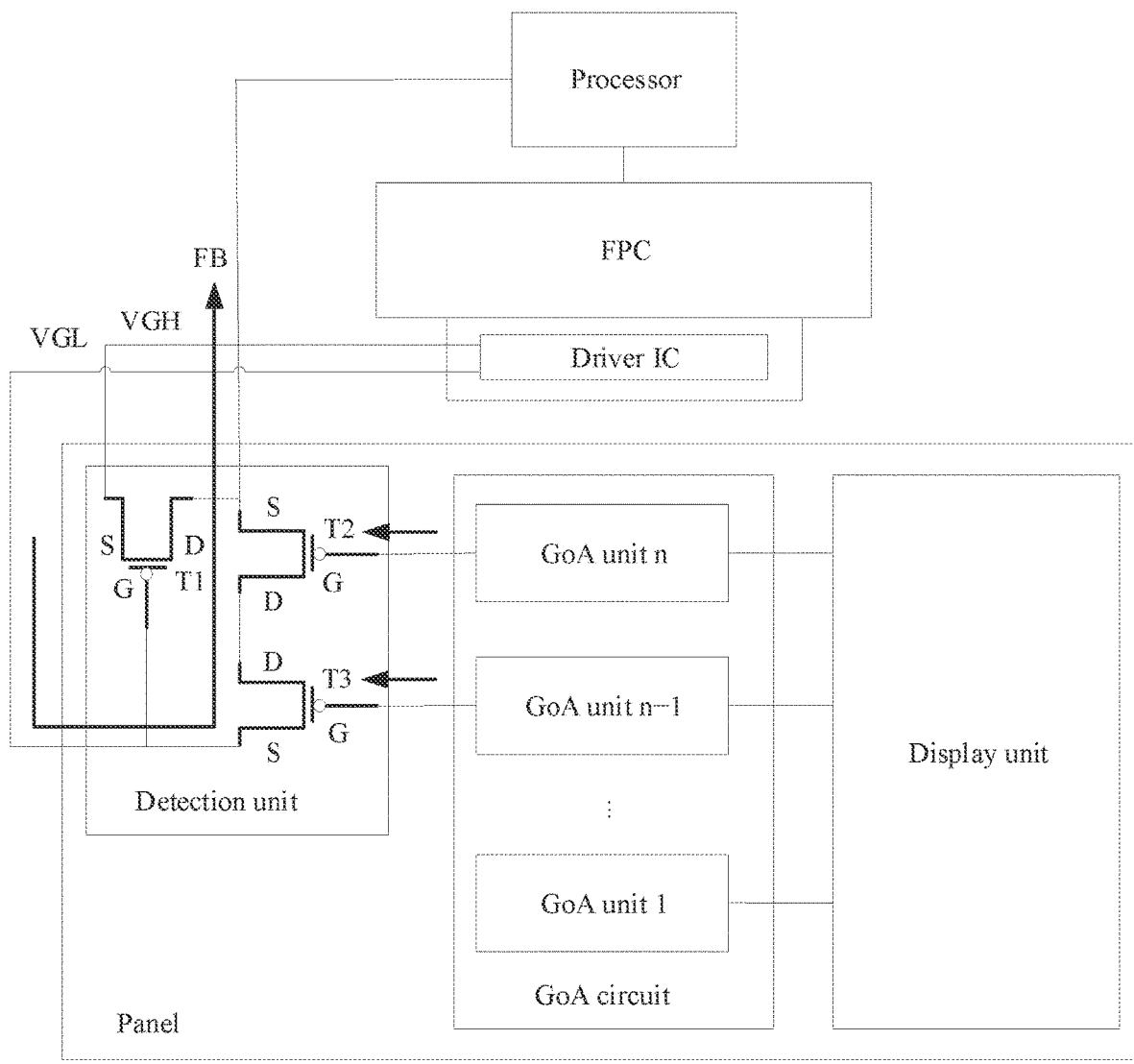
FIG. 12B is another display diagram of a running process of a detection unit according to Embodiment 4 of this application.

If two GoA units of the gate driver on array circuit run simultaneously, the GoA unit n-1 and the GoA unit n run and output scan signals simultaneously in a period of time, as an example displayed in FIG. 12B. Both the GoA unit n-1 and the GoA unit n output scan signals; and both the thin film transistor T2 and the thin film transistor T3 are switched on. In addition, because a driving capability of the thin film transistor T1 is weaker than those of the thin film transistor T2 and the thin film transistor T3, the VGH voltage is greater than the VGL voltage: the thin film transistor T1 is switched on; and the feedback signal FB output from the output port of the detection unit is jumped from the VGH voltage to the VGL voltage from a moment when two GoA units of the gate driver on array circuit run simultaneously.

In some embodiments, a length-width ratio and a size of the thin film transistor T1 are set to be relatively small, so that the driving capability of the thin film transistor T1 is relatively weak. The driving capabilities of the thin film transistor T2 and the thin film transistor T3 can be set to be greater than that of the thin film transistor T1 by designing sizes of the thin film transistor T2 and the thin film transistor T3 to be greater than that of the thin film transistor T1, designing length-width ratios of the thin film transistor T2 and the thin film transistor T3 to be greater than that of the thin film transistor T1, and so on.

In this embodiment, the processor receives the feedback signal transmitted by the detection unit, and may determine, based on the feedback signal, whether the gate driver on array circuit has the problem that a plurality of gate lines are started simultaneously while a scan signal is output. Specifically, if the feedback signal received by the processor is the VGH voltage, it is determined that the gate driver on array circuit does not have the problem that a plurality of gate lines are started simultaneously while a scan signal is output. If the feedback signal received by the processor is the VGL voltage, it is determined that the gate driver on array circuit has the problem that a plurality of gate lines are started simultaneously while a scan signal is output. In addition, the processor may further determine, based on a moment when the feedback signal jumps from the VGH voltage to the VGL voltage, a moment when the gate driver on array circuit starts to have the problem that a plurality of gate lines are started simultaneously while a scan signal is output.

In some embodiments, if the processor determines that the gate driver on array circuit has the problem that a plurality of gate lines are started simultaneously while a scan signal is output, the processor may restart or perform another action to resolve this problem.

It should be also noted that, in Embodiment 3 and Embodiment 4 of this application, that T1, T2, and T3 in the detection unit are P-type thin film transistors is described as an example. However, in the display screen provided in this embodiment of this application, T1, T2, and T3 of the detection unit are not limited to P-type thin film transistors. In some embodiments, T1, T2, and T3 of the detection unit may be other transistors that are of a same property, such as MOS transistors and switching transistors.

What is claimed is:

1. A display screen for use in an electronic device, wherein the display screen comprises:
    a display device;
    a gate driver on array circuit connected to the display device; and
    a detection circuit connected to the gate driver on array circuit;
    wherein:
    the gate driver on array circuit is configured to: generate a scan signal, and drive, by using the scan signal, the display device to perform displaying;
    the detection circuit is configured to: detect the scan signal of the gate driver on array circuit, and obtain and output a feedback signal, wherein the feedback signal is configured to determine whether a plurality of gate lines of the display device are driven simultaneously;
    the detection circuit comprises a first transistor, a second transistor, and a third transistor;
    a gate of the first transistor is configured to receive a first voltage, a source of the first transistor is configured to receive a second voltage, a drain of the first transistor is connected to a source of the second transistor, the first voltage is a switch-on voltage of a transistor in the gate driver on array circuit, the second voltage is a switch-off voltage of the transistor in the gate driver on array circuit, and a common terminal of the drain of the first transistor and the source of the second transistor is configured to output the feedback signal;
    a gate of the second transistor is connected to one gate driver on array (GoA) unit of the gate driver on array circuit, and a drain of the second transistor is connected to a drain of the third transistor; and
    a gate of the third transistor is connected to another GoA unit of the gate driver on array circuit, and a source of the third transistor is configured to receive the first voltage.

2. The display screen according to claim 1, wherein the detection circuit is connected to two GoA units at a tail end of the gate driver on array circuit.

3. The display screen according to claim 1,
    wherein the detection circuit is further configured to connect to a display screen control circuit of the display screen, so that the detection circuit sends the feedback signal to the display screen control circuit; and
    wherein the display screen control circuit is configured to determine an identification result based on the feedback signal, wherein the identification result is used to indicate whether the gate driver on array circuit uses the scan signal to drive the plurality of gate lines of the display device simultaneously.

4. The display screen according to claim 3,
    wherein the display screen control circuit identifies that the feedback signal is the first voltage, and determines a first identification result, wherein the first identification result is used to indicate that the gate driver on array circuit does not use the scan signal to drive the plurality of gate lines of the display device simultaneously, and the first voltage is the switch-on voltage of the transistor in the gate driver on array circuit; or wherein the display screen control circuit identifies that the feedback signal is the second voltage, and determines a second identification result, wherein the second identification result is used to indicate that the gate driver on array circuit uses the scan signal to drive the plurality of gate lines of the display device simultaneously, and the second voltage is the switch-off voltage of the transistor in the gate driver on array circuit.

5. The display screen according to claim 3, wherein the display screen control circuit is further configured to send the identification result to a processor of the electronic device.

6. The display screen according to claim 1,
wherein the detection circuit is further configured to connect to a processor of the electronic device, so that the detection circuit transmits the feedback signal to the processor; and
wherein the processor is configured to determine an identification result based on the feedback signal, wherein the identification result is used to indicate whether the gate driver on array circuit uses the scan signal to drive the plurality of gate lines of the display device simultaneously.

7. The display screen according to claim 6,
wherein the processor identifies that the feedback signal is the first voltage, and determines a first identification result, wherein the first identification result is used to indicate that the gate driver on array circuit does not use the scan signal to drive the plurality of gate lines of the display device simultaneously, and the first voltage is the switch-on voltage of the transistor in the gate driver on array circuit; or wherein the processor identifies that the feedback signal is the second voltage, and determines a second identification result, wherein the second identification result is used to indicate that the gate driver on array circuit uses the scan signal to drive the plurality of gate lines of the display device simultaneously, and the second voltage is the switch-off voltage of the transistor in the gate driver on array circuit.

8. The display screen according to claim 1, wherein a length-width ratio of the first transistor is less than a length-width ratio of the second transistor, and the length-width ratio of the first transistor is less than a length-width ratio of the third transistor.

9. The display screen according to claim 1, wherein a size of the first transistor is less than a size of the second transistor, and the size of the first transistor is less than a size of the third transistor.

10. The display screen according to claim 1, wherein each of the first transistor, the second transistor, and the third transistor comprises an N-type thin film transistor (TFT) or a P-type TFT.

11. An electronic device, comprising:
one or more processors, a memory, and the display screen according to claim 1,
wherein the memory is coupled to the one or more processors, the memory is configured to store computer program code, and the computer program code comprises computer instructions.

* * * * *